(12) United States Patent
Lai

(10) Patent No.: US 12,482,665 B2
(45) Date of Patent: Nov. 25, 2025

(54) METHOD OF MANUFACTURING SEMICONDUCTOR STRUCTURE

(71) Applicant: NANYA TECHNOLOGY CORPORATION, New Taipei (TW)

(72) Inventor: Hsuan-Wu Lai, Yilan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 418 days.

(21) Appl. No.: 18/105,336

(22) Filed: Feb. 3, 2023

(65) Prior Publication Data
US 2024/0266184 A1 Aug. 8, 2024

(51) Int. Cl.
*H01L 21/311* (2006.01)
*H01L 21/02* (2006.01)

(52) U.S. Cl.
CPC .... *H01L 21/31122* (2013.01); *H01L 21/0243* (2013.01); *H01L 21/02488* (2013.01); *H01L 21/02532* (2013.01); *H01L 21/0262* (2013.01); *H01L 21/02658* (2013.01); *H01L 21/02115* (2013.01); *H01L 21/02271* (2013.01); *H01L 21/02592* (2013.01); *H01L 21/02595* (2013.01)

(58) Field of Classification Search
None
See application file for complete search history.

(56) References Cited

U.S. PATENT DOCUMENTS

| | | | |
|---|---|---|---|
| 6,059,879 A | 5/2000 | Gonzalez | |
| 6,150,696 A * | 11/2000 | Iwamatsu | H10D 86/01 257/349 |
| 2002/0160610 A1 * | 10/2002 | Arai | H01L 21/76819 438/692 |
| 2004/0157461 A1 * | 8/2004 | Kononchuk | H01L 21/3065 257/E21.214 |
| 2005/0224794 A1 * | 10/2005 | Tanaka | H01L 21/32137 257/E21.583 |
| 2005/0282093 A1 | 12/2005 | Dammel et al. | |
| 2006/0084274 A1 | 4/2006 | Rennie et al. | |

(Continued)

FOREIGN PATENT DOCUMENTS

TW 202131453 A 8/2021

OTHER PUBLICATIONS

Office Action and the search report mailed on Mar. 27, 2024 related to Taiwanese Application No. 112129030.

(Continued)

*Primary Examiner* — Allan W. Olsen
(74) *Attorney, Agent, or Firm* — Xuan Zhang

(57) ABSTRACT

A method of manufacturing a semiconductor structure is provided. The method includes providing a semiconductor wafer having a central region and a bevel region; forming a first material layer over the central region and the bevel region of the semiconductor wafer; performing a dry etching operation on a portion of the first material layer over the bevel region of the semiconductor wafer; performing a wet etching operation on the portion of the first material layer over the bevel region of the semiconductor wafer; performing a baking operation on the bevel region of the semiconductor wafer; and forming a second material layer on the central region and the bevel region of the semiconductor wafer after performing the baking operation.

10 Claims, 24 Drawing Sheets

(56) References Cited

U.S. PATENT DOCUMENTS

| | | |
|---|---|---|
| 2007/0128554 A1 | 6/2007 | Kawamura et al. |
| 2007/0148913 A1* | 6/2007 | Kim ................... H01L 21/31116 257/E21.252 |
| 2009/0014127 A1 | 1/2009 | Shah et al. |
| 2010/0048022 A1* | 2/2010 | Kubota ............... H01L 21/0337 118/723 R |
| 2010/0096084 A1* | 4/2010 | Lee ................... H01L 21/67069 156/345.43 |
| 2010/0273333 A1* | 10/2010 | Kato ................. H01L 21/67248 392/416 |
| 2011/0256685 A1 | 10/2011 | Suzuki et al. |
| 2012/0282766 A1* | 11/2012 | Fischer ............. H01L 21/02274 438/597 |
| 2013/0171831 A1 | 7/2013 | Namba et al. |
| 2017/0186600 A1* | 6/2017 | Ostermaier ....... H01L 21/30612 |
| 2018/0046086 A1 | 2/2018 | Waller et al. |
| 2020/0002568 A1* | 1/2020 | Yao ........................ C08G 75/20 |
| 2020/0211847 A1 | 7/2020 | Seo et al. |
| 2020/0365404 A1* | 11/2020 | Khaja ..................... C23C 16/26 |
| 2020/0388626 A1 | 12/2020 | Baraskar et al. |
| 2021/0005465 A1 | 1/2021 | Fujita |
| 2021/0013400 A1* | 1/2021 | Dutta .................... G11C 11/161 |
| 2021/0082865 A1 | 3/2021 | Baraskar et al. |
| 2021/0296118 A1* | 9/2021 | Sil ..................... H01L 21/02057 |
| 2023/0031662 A1* | 2/2023 | Lee ....................... C30B 25/186 |
| 2023/0107357 A1 | 4/2023 | Dictus et al. |
| 2023/0268201 A1* | 8/2023 | Lee ......................... H01L 21/67 118/722 |
| 2024/0036474 A1 | 2/2024 | Peter et al. |
| 2024/0266184 A1 | 8/2024 | Lai |
| 2024/0312801 A1 | 9/2024 | Arakawa |

OTHER PUBLICATIONS

Office Action and and the search report mailed on Jul. 2, 2025 related to U.S. Appl. No. 18/105,333.

\* cited by examiner

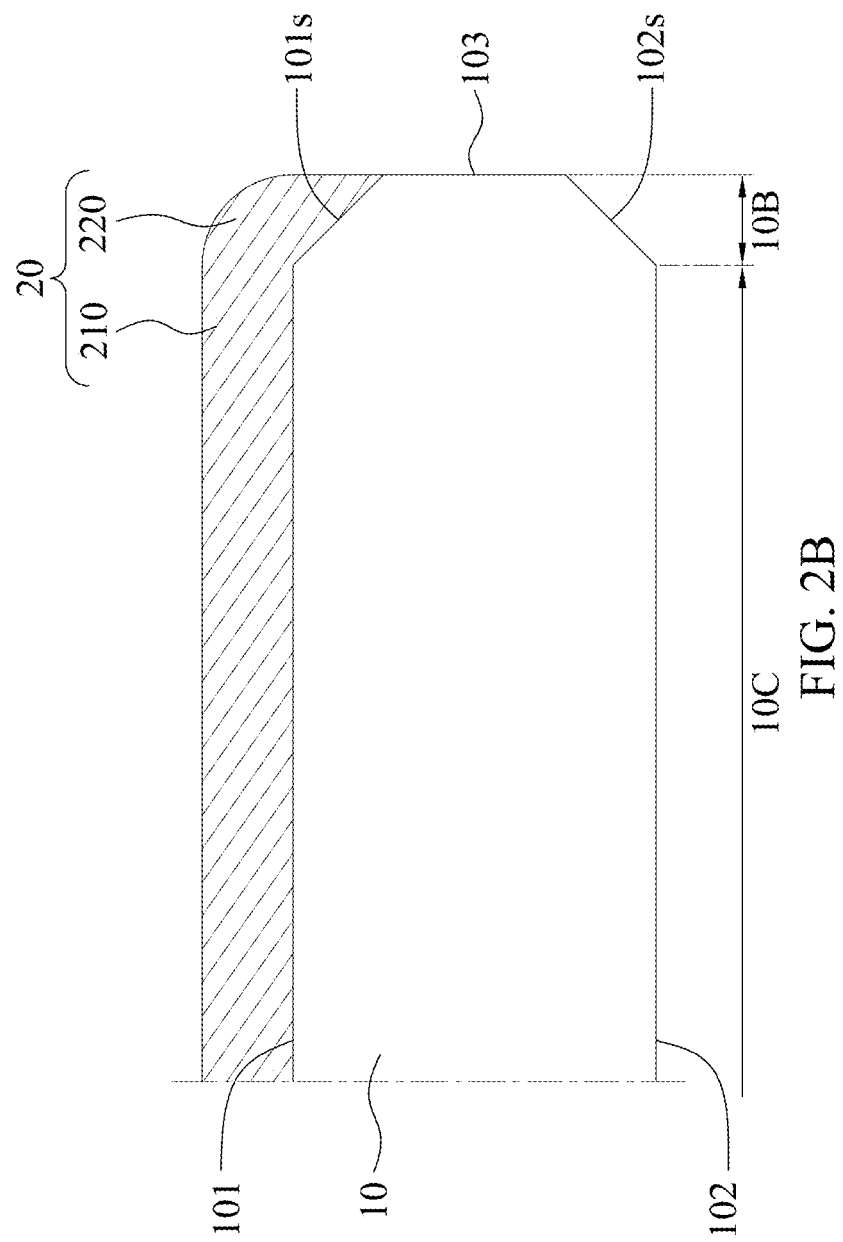

METHOD OF MANUFACTURING SEMICONDUCTOR STRUCTURE

TECHNICAL FIELD

The present disclosure relates to a method of manufacturing a semiconductor structure, and more particularly, to a method of manufacturing a semiconductor structure including one or more layers formed over a wafer bevel region.

DISCUSSION OF THE BACKGROUND

Generally, manufacturing integrated circuits includes forming multiple layers stacked on each other through various operations. Each of the layers may serve to perform a specific function, such as serving as a conductive structure, a dielectric structure, an adhesion structure for increasing an adhesive strength between two adjacent layers, or other functional features depending on actual applications. After the stacked structure including multiple layers is formed, one or more etching operations may be further performed to pattern the stacked structure for forming required devices.

However, the multiple layers of the stacked structure may be formed not only over a wafer central region but also over a wafer bevel region. As the thickness of the stacked structure on the wafer bevel region increases, various issues may occur, such as delamination or peelings.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a method of manufacturing a semiconductor structure. The method includes providing a semiconductor wafer having a central region and a bevel region. The method also includes forming a carbon-containing layer over the central region and the bevel region of the semiconductor wafer. The method further includes performing a wet etching operation to remove the carbon-containing over the bevel region of the semiconductor wafer. The method also includes performing a baking operation on the bevel region of the semiconductor wafer.

Another aspect of the present disclosure provides a method of manufacturing a semiconductor structure. The method includes providing a semiconductor wafer having a bevel region. The method also includes forming a carbon-containing layer over the bevel region of the semiconductor wafer. The method further includes performing an anisotropic etching operation on the carbon-containing layer over the bevel region of the semiconductor wafer. The method also includes performing a wet etching operation on the carbon-containing layer over the bevel region of the semiconductor wafer. The method further includes performing a baking operation on the bevel region of the semiconductor wafer.

Another aspect of the present disclosure provides a method of manufacturing a semiconductor structure. The method includes providing a semiconductor wafer having a central region and a bevel region. The method also includes forming a carbon-containing layer over the bevel region of the semiconductor wafer. The method further includes performing an anisotropic etching operation on the carbon-containing layer over the bevel region of the semiconductor wafer. The method also includes performing a wet etching operation on the carbon-containing layer over the bevel region of the semiconductor wafer. The method further includes performing a baking operation on the bevel region of the semiconductor wafer.

In the method of manufacturing the semiconductor structure, a bevel trimming operation includes performing at least a wet etching operation and a baking operation. The wet etching operation can fully remove a portion of layers or structures over the bevel region of a semiconductor wafer, and the following baking operation can further remove any remained etching solution and impurities therein from the wet etching operation. As such, a relatively clean surface over the bevel region can be provided for subsequent film formation. Therefore, defects, particularly in-film defects, possibly formed within a film subsequently formed over the bevel region can be minimized.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

FIG. 2B is a cross-section illustrating one stage of a method of manufacturing a semiconductor structure, in accordance with some embodiments of the present disclosure.

DETAILED DESCRIPTION

Figure 1:
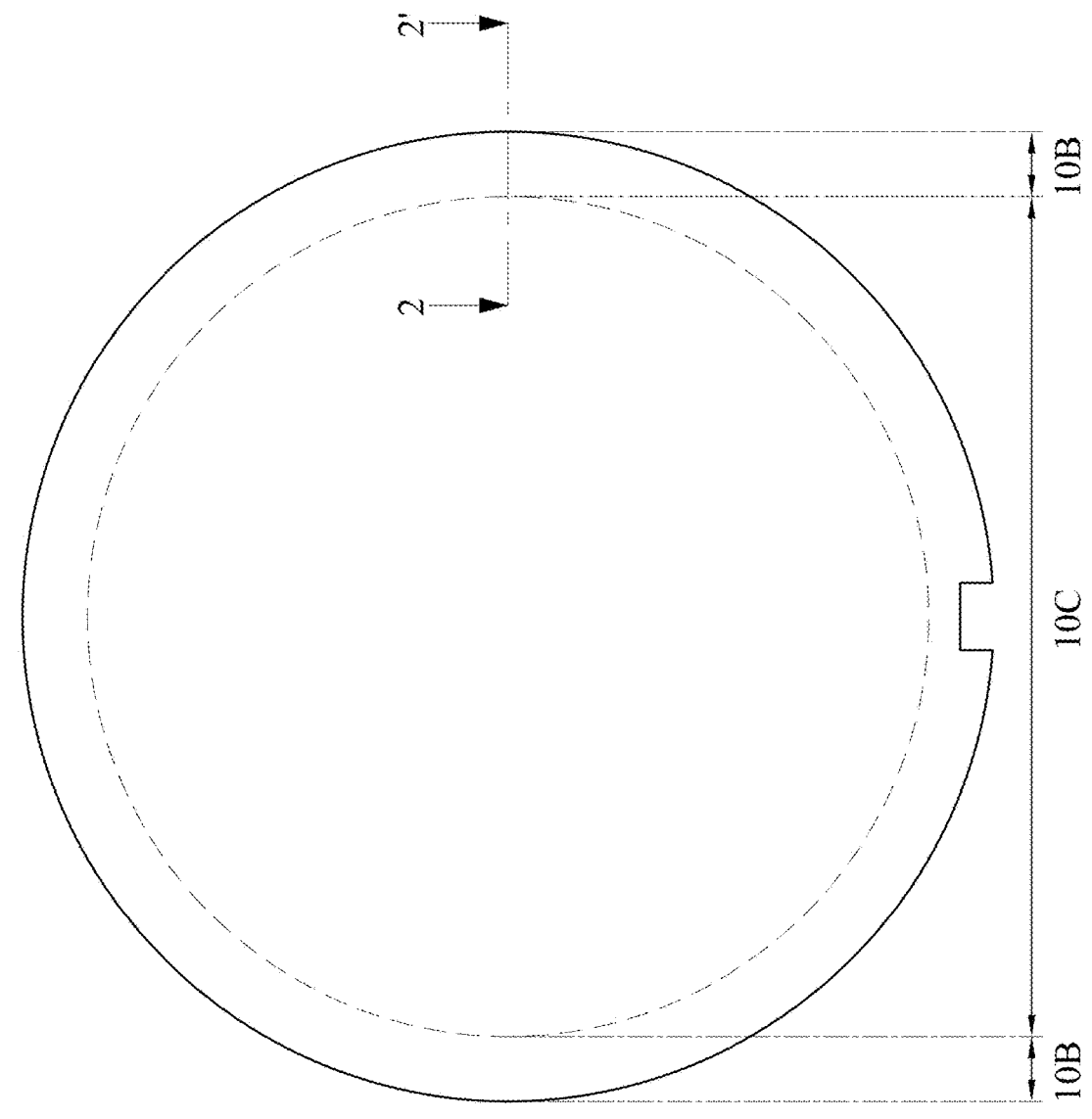
FIG. 1 is a top view illustrating one stage of a method of manufacturing a semiconductor structure, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1, FIG. 2A, FIG. 2B, FIG. 2C, FIG. 2D, FIG. 2E, FIG. 2F, and FIG. 2G illustrate various stages of a method of manufacturing a semiconductor structure 1, in accordance with some embodiments of the present disclosure.

Referring to FIG. 1, FIG. 1 is a top view illustrating one stage of a method of manufacturing a semiconductor structure 1, in accordance with some embodiments of the present disclosure.

A semiconductor wafer 10 may be provided. In some embodiments, the semiconductor wafer 10 may be or include a substrate. In some embodiments, the semiconductor wafer 10 has a central region 10C (also referred to as "a device region") and a bevel region 10B (also referred to as "a wafer bevel region" or "a wafer edge"). In some embodiments, the bevel region 10B surrounds the central region 10C. In some embodiments, the bevel region 10B is distinct from the central region 10C. In some embodiments, the bevel region 10B is free from overlapping the central region 10C. In some embodiments, the bevel region 10B directly connects to the central region 10G. In some embodiments, one or more layers or structures (not shown) are already formed on the substrate of the semiconductor wafer 10. The semiconductor wafer 10 may be formed of, for example, silicon, doped silicon, silicon germanium, silicon on insulator, silicon on sapphire, silicon germanium on insulator, silicon carbide, germanium, gallium arsenide, gallium phosphide, gallium arsenide phosphide, indium phosphide, indium gallium phosphide, or any other IV-IV, III-V or I-VI semiconductor material.

Figure 2A:
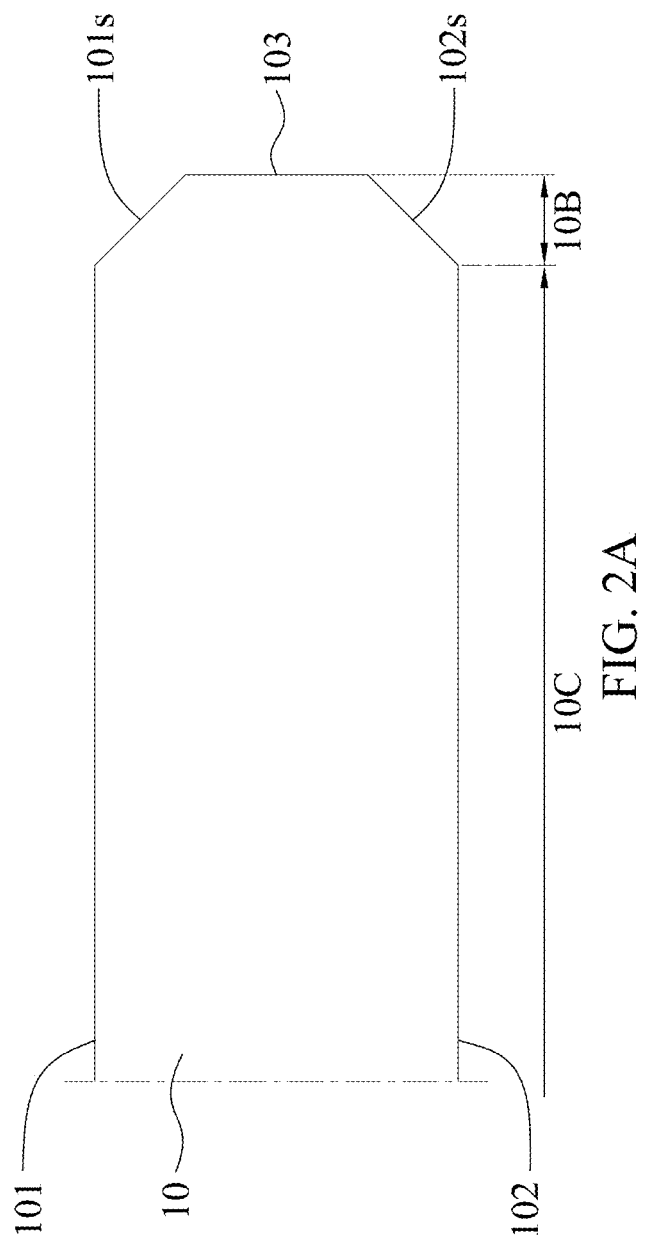
FIG. 2A is a cross-section illustrating one stage of a method of manufacturing a semiconductor structure, in accordance with some embodiments of the present disclosure.

Referring to FIG. 2A, FIG. 2A is a cross-section illustrating one stage of a method of manufacturing a semiconductor structure 1, in accordance with some embodiments of the present disclosure. In some embodiments, FIG. 2A is a cross-section along the cross-sectional line 2-2' of FIG. 1.

The semiconductor wafer 10 may have an upper surface 101 and a bottom surface 102 opposite to the upper surface. In some embodiments, the semiconductor wafer 10 may have an inclined surface 101s (also referred to as "a slanted surface") over the bevel region 10B. The inclined surface 101s may directly connect to the upper surface 101. The semiconductor wafer 10 may have a lateral surface 103 connected to the inclined surface 101s. In some embodiments, the semiconductor wafer 10 may have an inclined surface 102s (also referred to as "a slanted surface") under the bevel region 10B. The inclined surface 102s may directly connect to the bottom surface 102. The lateral surface 103 may extend between the inclined surface 101s and the inclined surface 102s. In some embodiments, the lateral surface 103 may be substantially perpendicular to the upper surface 101. The lateral surface 103 may be at an apex region of the semiconductor wafer 10.

Referring to FIG. 2B, FIG. 2B is a cross-section illustrating one stage of a method of manufacturing a semiconductor structure 1, in accordance with some embodiments of the present disclosure. In some embodiments, FIG. 2B is a cross-section along the cross-sectional line 2-2' of FIG. 1.

A material layer 20 may be formed over the central region 10C and the bevel region 10B of the semiconductor wafer 10. In some embodiments, the material layer 20 is formed over the upper surface 101 and the inclined surface 101s of the semiconductor wafer 10. In some embodiments, one or more layers or structures (not shown) may be already formed over the upper surface 101 and the inclined surface 101s of the semiconductor wafer 10, and thus the aforesaid one or more layers or structures (not shown) may be formed between the material layer 20 and the upper surface 101 and the inclined surface 101s of the semiconductor wafer 10. In some embodiments, the material layer 20 includes a portion 210 over the central region 10C and a portion 220 over the bevel region 10B. In some embodiments, the material layer includes a portion 210 over the upper surface 101 and a portion 220 over the inclined surface 101s of the semiconductor wafer 10. In some embodiments, the portion 220 of the material layer 20 may further extend on the lateral surface 103 of the semiconductor wafer 10 (not shown in drawings). In some embodiments, the portion 220 of the material layer 20 may further extend to the inclined surface 102s of the semiconductor wafer 10 (not shown in drawings). In some embodiments, the material layer 20 may be or include a carbon-containing layer.

In some embodiments, the material layer 20 may be or include amorphous carbon, diamond-like carbon (DLC), or a combination thereof. In some embodiments, a thickness of the material layer 20 is from about 120 nm to about 160 nm. In some embodiments, a thickness of the material layer 20 is about 140 nm. In some embodiments, the material layer 20 is formed by chemical vapor deposition (CVD). In some embodiments, the material layer 20 is formed by a CVD operation using $C_2H_2$ as a precursor. In some embodiments, the deposition temperature for the CVD operation may be from about 250° C. to about 300° C. In some embodiments, the deposition temperature for the CVD operation may be about 275° C. In some embodiments, the deposition time for the CVD operation may be from about 130 seconds to about 160 seconds. In some embodiments, the deposition time for the CVD operation may be about 145 seconds.

Figure 2C:
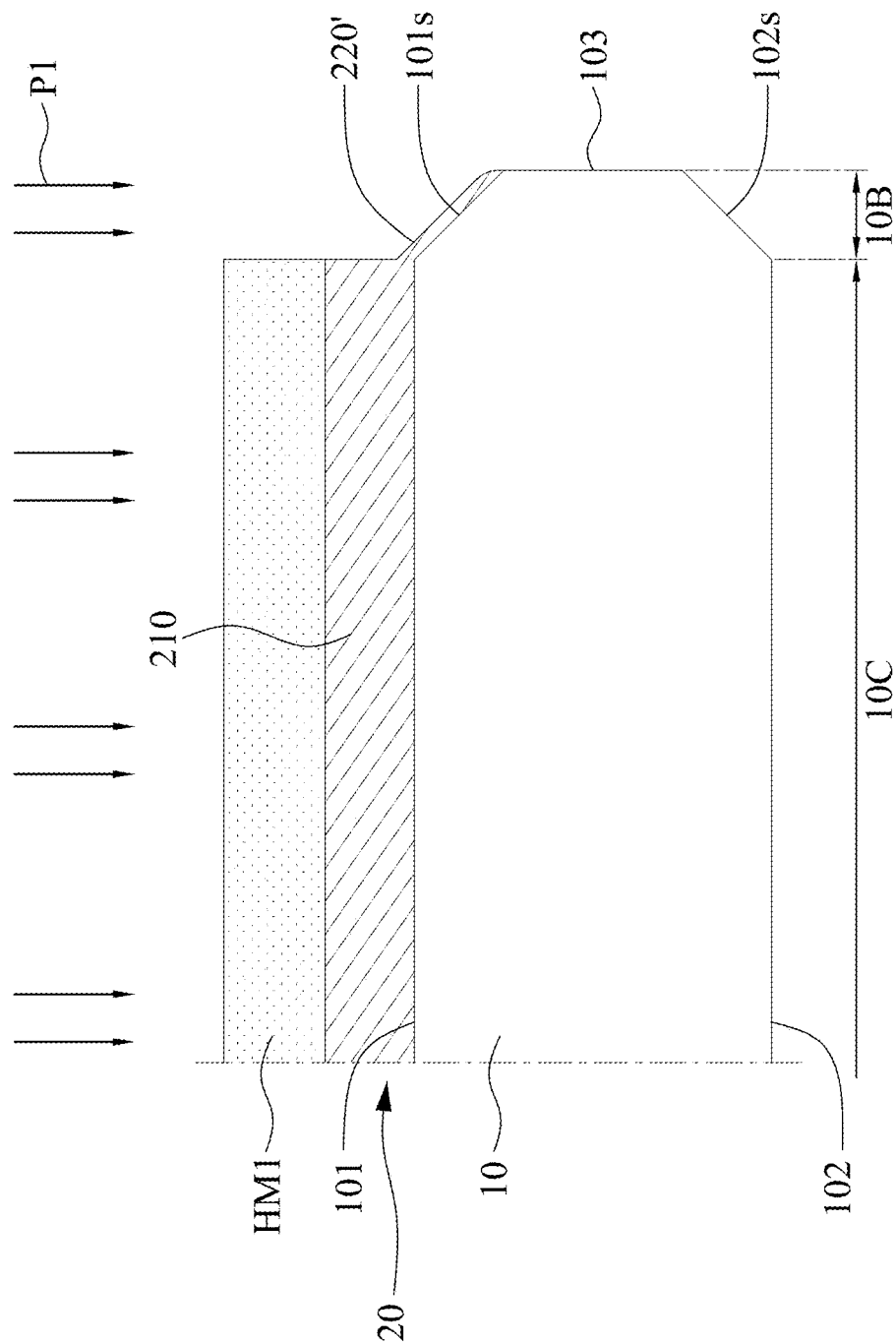
FIG. 2C is a cross-section illustrating one stage of a method of manufacturing a semiconductor structure, in accordance with some embodiments of the present disclosure.

Referring to FIG. 2C, FIG. 2C is a cross-section illustrating one stage of a method of manufacturing a semiconductor structure 1, in accordance with some embodiments of the present disclosure. In some embodiments, FIG. 2C is a cross-section along the cross-sectional line 2-2' of FIG. 1.

A dry etching operation P1 may be performed on the material layer 20. In some embodiments, the material layer 20 is partially removed by the dry etching operation P1. In some embodiments, the dry etching operation P1 is performed on the portion 220 of the material layer 20 over the bevel region 10B of the semiconductor wafer 10. In some embodiments, the portion 220 of the material layer 20 over the bevel region 10B of the semiconductor wafer 10 is partially removed by the dry etching operation P1. In some embodiments, the portion 220 of the material layer 20 is partially removed to form a remained portion 220' of the material layer 20 over the bevel region 10B of the semiconductor wafer 10. In some embodiments, the remained portion 220' is formed on the inclined surface 101s of the semiconductor wafer 10. In some embodiments, the remained portion 220' is further formed on at least a portion of the lateral surface 103 of the semiconductor wafer 10 (not shown in drawings). In some embodiments, the remained portion 220' is further formed on at least a portion of the inclined surface 102s of the semiconductor wafer 10 (not shown in drawings). In some embodiments, a hardmask layer HM1 may be disposed over the central region 10C to cover the portion 210 of the material layer 20 when performing the dry etch operation P1. The hardmask layer HM1 can protect the portion 210 of the material layer 20 over the central region 10C from being etched by the dry etching operation P1.

The dry etching operation P1 may be an anisotropic etching operation. In some embodiments, the dry etching operation P1 may be or include a plasma dry etching operation. In some embodiments, the dry etching operation P1 may be or include a plasma dry etching operation using oxygen gas as an etching gas. In some embodiments, the material layer 20 includes a carbon-containing layer, and oxygen gas used as an etching gas can react with carbon to form carbon dioxide gas as a product. As such, the material layer 20 can be removed, and the as-formed product is carbon dioxide gas which can be removed easily. Accordingly, the dry etching operation P1 serving to partially remove the material layer 20 can provide a relatively clean reaction condition while only a gas product is formed which can be removed easily. In addition, the removal operation of the material layer 20 by the dry etching operation P1 is relatively simplified.

Figure 2D:
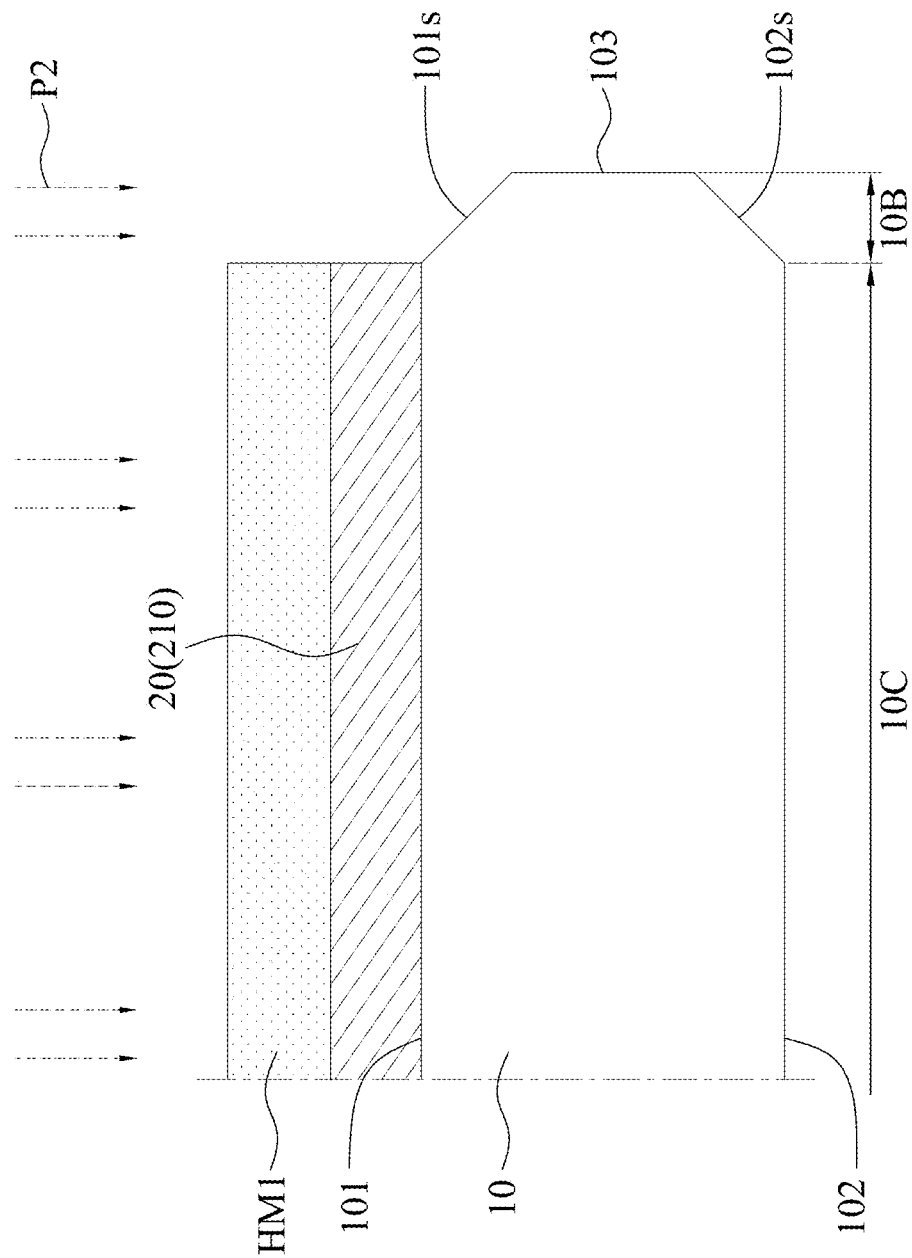
FIG. 2D is a cross-section illustrating one stage of a method of manufacturing a semiconductor structure, in accordance with some embodiments of the present disclosure.

Referring to FIG. 2D, FIG. 2D is a cross-section illustrating one stage of a method of manufacturing a semiconductor structure 1, in accordance with some embodiments of the present disclosure. In some embodiments, FIG. 2D is a cross-section along the cross-sectional line 2-2' of FIG. 1.

A wet etching operation P2 may be performed to remove the material layer 20 over the bevel region 10B of the semiconductor wafer 10. In some embodiments, the wet etching operation P2 is performed after performing the dry etching operation P1 (or the anisotropic etching operation). In some embodiments, the material layer 20 over the bevel region 10B of the semiconductor wafer 10 is fully removed by the wet etching operation P2. In some embodiments, the remained portion 220' of the material layer 20 over the bevel region 10B of the semiconductor wafer 10 is fully removed by the wet etching operation P2. In some embodiments, the remained portion 220' of the material layer 20 on the inclined surface 101s of the semiconductor wafer 10 is fully removed by the wet etching operation P2. In some embodiments, the remained portion 220' of the material layer 20 on the lateral surface 103 of the semiconductor wafer 10 is fully removed by the wet etching operation P2. In some embodiments, the remained portion 220' of the material layer 20 on the inclined surface 102s of the semiconductor wafer 10 is fully removed by the wet etching operation P2. In some embodiments, the portion 210 of the material layer 20 is remained on the central region 10C of the semiconductor wafer 10 after the wet etching operation P2 is performed. In some embodiments, the wet etching operation P2 may be performed by using a mixture including ammonia ($NH_4OH$) and hydrogen peroxide ($H_2O_2$) as an etching solution.

Figure 2E:
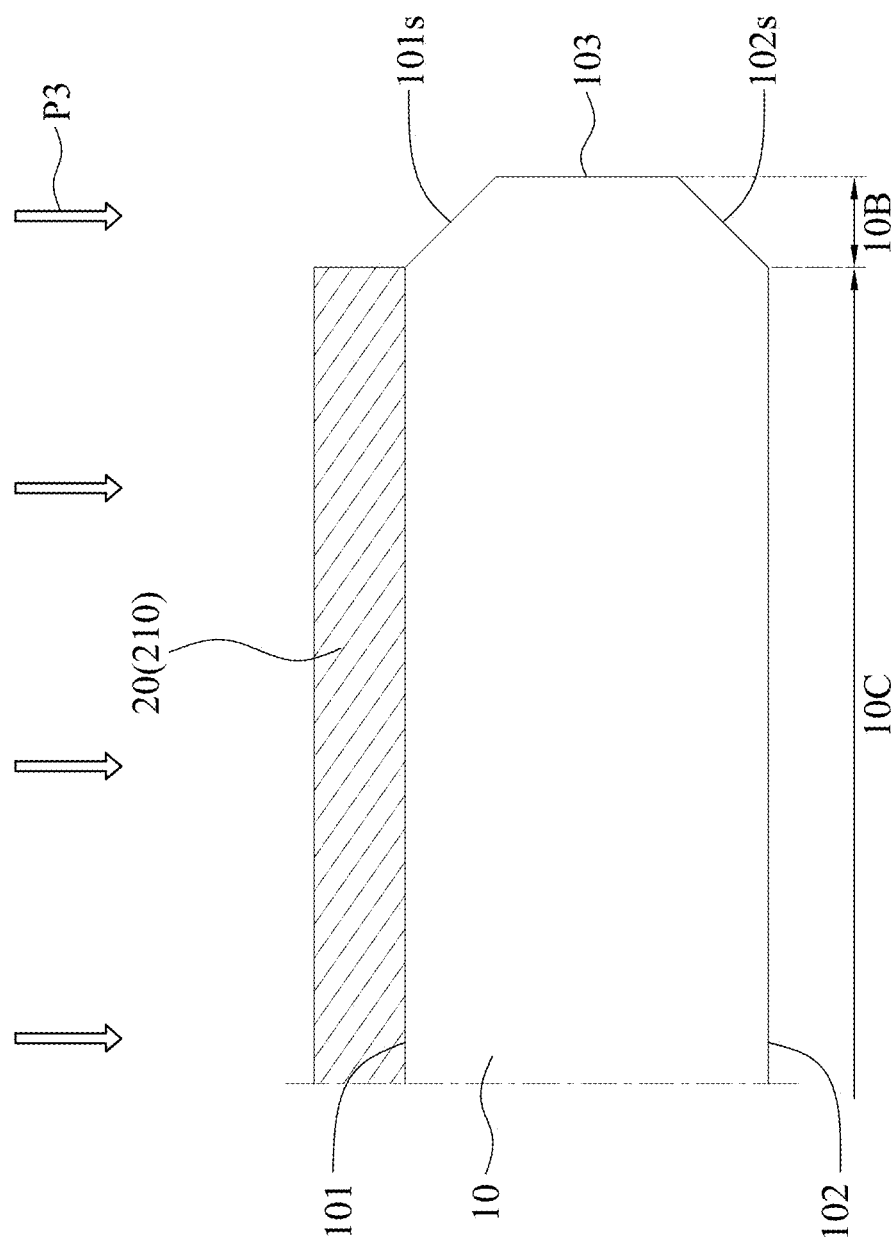
FIG. 2E is a cross-section illustrating one stage of a method of manufacturing a semiconductor structure, in accordance with some embodiments of the present disclosure.

Referring to FIG. 2E, FIG. 2E is a cross-section illustrating one stage of a method of manufacturing a semiconductor structure 1, in accordance with some embodiments of the present disclosure. In some embodiments, FIG. 2E is a cross-section along the cross-sectional line 2-2' of FIG. 1.

A baking operation P3 may be performed on the bevel region 10B of the semiconductor wafer 10. In some embodiments, the baking operation P3 is performed under a temperature equal to or greater than about 100° C. In some embodiments, the baking operation P3 is performed under a temperature equal to or greater than about 150° C. In some embodiments, the baking operation P3 is performed under a temperature equal to or greater than about 200° C. In some embodiments, the baking operation P3 is performed under a temperature equal to or greater than about 300° C. In some embodiments, the baking operation P3 is performed under a temperature equal to or greater than about 400° C. In some embodiments, the baking operation P3 is performed under a temperature from about 350° C. to about 450° C. In some embodiments, the baking operation P3 is performed for equal to or greater than about 90 seconds. In some embodiments, the baking operation P3 is performed for equal to or greater than about 120 seconds. In some embodiments, the baking operation P3 is performed for about 90 seconds to about 200 seconds. In some embodiments, the baking operation P3 is performed for about 100 seconds to about 150 seconds. In some embodiments, the baking operation P3 is performed for about 110 seconds to about 130 seconds. In some embodiments, the baking operation P3 is performed under a temperature of about 400° C. and for about 120 seconds.

The aforesaid ranges of the temperature of the baking operation P3 and the aforesaid ranges of the time duration of the baking operation P3 are critical as these parameters are provided with unexpected effects. While the baking temperature is relatively low or below the aforesaid ranges, the heat provided by the baking operation may be insufficient to completely remove the remained etching solution from the wet etching operation P2; on the other hand, while the baking temperature is relatively high or exceed the aforesaid ranges, the heat provided by the baking operation may apply too much energy onto the structure and deteriorate the structural stability. In addition, while the baking time is relatively short or below the aforesaid ranges, the heat provided by the baking operation may be insufficient to completely remove the remained etching solution from the wet etching operation P2; on the other hand, while the baking time is relatively long or exceed the aforesaid ranges, the overall processing time may undesirably increase, which may result in a decrease of the unit per hour (UPH) of the manufacturing process.

According to some embodiments of the present disclosure, with the aforesaid specific temperature or temperature ranges of the baking operation P3, the remained etching solution from the wet etching operation P2 can be removed to provide a relatively clean surface for subsequent film formation (e.g., for the formation of the material layer 30), and the structure can be provided with a satisfactory stability. In addition, with the aforesaid specific time duration or time duration ranges of the baking operation P3, the remained etching solution from the wet etching operation P2 can be removed to provide a relatively clean surface for subsequent film formation (e.g., for the formation of the material layer 30), and the UPH of the manufacturing process can be improved.

In some embodiments, the hardmask layer HM1 is removed prior to performing the baking operation P3. In some embodiments, the combination of the dry etching operation P1, the wet etching operation P2, and the baking operation P3 is referred to as a bevel trimming operation.

Figure 2F:
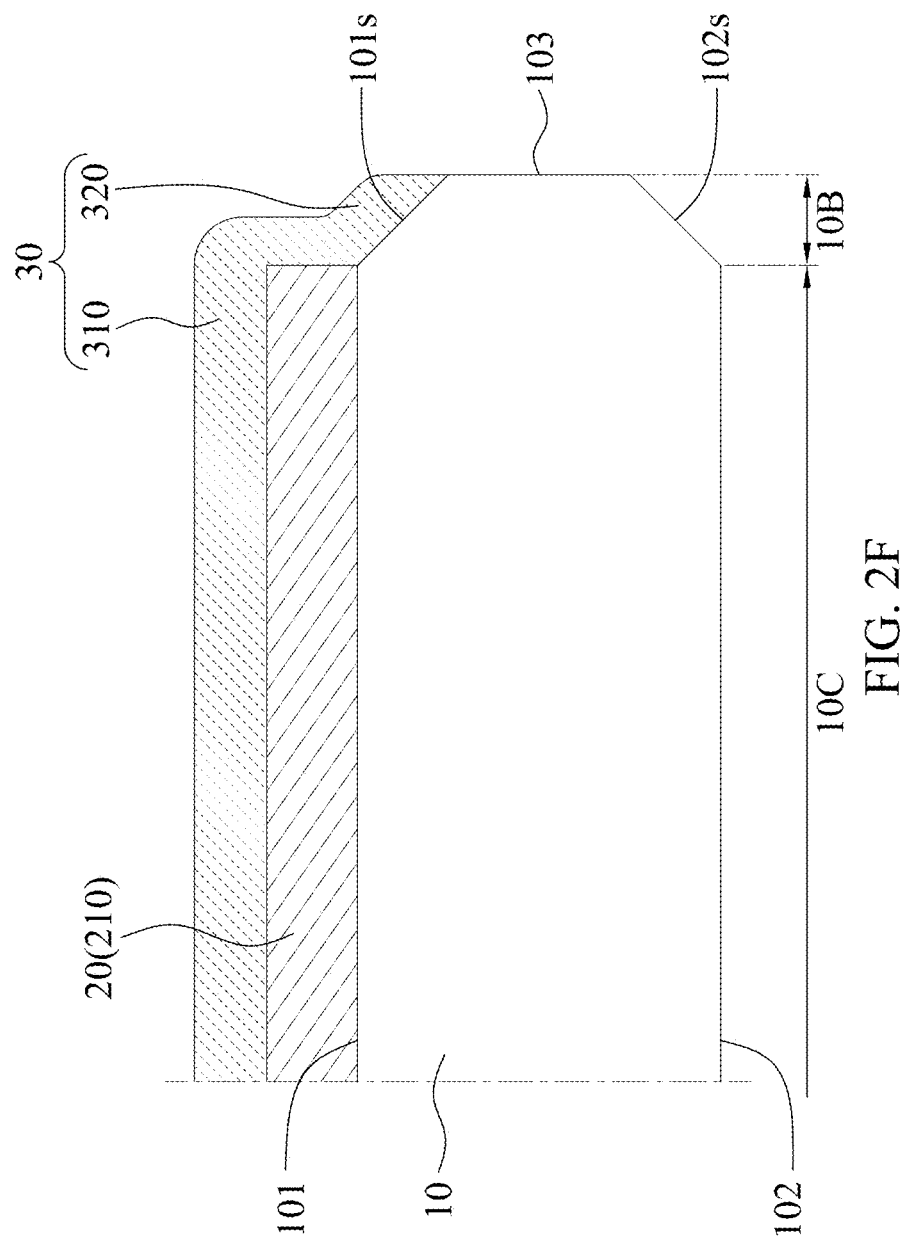
FIG. 2F is a cross-section illustrating one stage of a method of manufacturing a semiconductor structure, in accordance with some embodiments of the present disclosure.

Referring to FIG. 2F, FIG. 2F is a cross-section illustrating one stage of a method of manufacturing a semiconductor structure 1, in accordance with some embodiments of the present disclosure. In some embodiments, FIG. 2F is a cross-section along the cross-sectional line 2-2' of FIG. 1.

A material layer 30 may be formed over the central region 10C and the bevel region 10B of the semiconductor wafer 10. A material layer 30 may be formed over the upper surface 101 and the inclined surface 101s of the semiconductor wafer 10. In some embodiments, the material layer 30 is formed on the portion 210 of the material layer 20 that is formed on the central region 10C of the semiconductor wafer 10. In some embodiments, a portion 310 of the material layer 30 is formed on the portion 210 of the material layer 20. In some embodiments, a portion 320 of the material layer 30 is formed on the bevel region 10B of the semiconductor wafer 10 and is free from contacting the material layer 20 (i.e., the portion 210 of the material layer 20).

In some embodiments, the material layer 30 is formed over the central region 10C and the bevel region 10B of the semiconductor wafer 10 after the baking operation P3 is performed. In some embodiments, forming the material layer 30 and performing the baking operation P3 are performed in an in-situ manner. In some embodiments, forming the material layer 30 and performing the baking operation P3 are performed in the same processing chamber. In some embodiments, the intermediate structure illustrated in FIG. 2E is transported to or disposed in a processing chamber in which forming the material layer 30 is performed, the baking operation P3 is then performed in the processing chamber, and then the material layer 30 is formed after the baking operation P3 is completed. In some embodiments, a temperature for forming the material layer 30 and a temperature for performing the baking operation P3 are substantially the same. In some embodiments, forming the material layer 30 and performing the baking operation P3 use the same heating apparatus.

In some other embodiments, forming the material layer 30 and performing the baking operation P3 are performed in different processing chambers. In some embodiments, the intermediate structure illustrated in FIG. 2E is transported to or disposed in a processing chamber (or "a first processing chamber"), and the baking operation P3 is then performed in the processing chamber. Next, after the baking operation P3 is completed, the intermediate structure is then transported to or disposed in a different processing chamber (or "a second processing chamber"), and then the material layer 30 is formed on the intermediate structure in the different processing chamber. In some embodiments, a temperature for forming the material layer 30 and a temperature for performing the baking operation P3 are substantially the same or different.

In some embodiments, the material layer 30 is different from the material layer 20. In some embodiments, the material layer 30 and the material layer 20 are formed of different materials. In some embodiments, the material layer 30 may be or include a silicon-containing layer. In some embodiments, the material layer 30 may be or include amorphous silicon, polysilicon, doped silicon, or a combination thereof. In some embodiments, a thickness of the material layer 30 is from about 60 nm to about 80 nm. In some embodiments, a thickness of the material layer 30 is about 70 nm. In some embodiments, the material layer 30 is formed by chemical vapor deposition (CVD). In some embodiments, the material layer 30 is formed by a CVD operation using $SiH_4$ as a precursor. In some embodiments, the deposition temperature for the CVD operation may be from about 350° C. to about 450° C. In some embodiments, the deposition temperature for the CVD operation may be about 400° C. In some embodiments, the deposition time for the CVD operation may be from about 150 seconds to about 180 seconds. In some embodiments, the deposition time for the CVD operation may be about 165 seconds.

Figure 2G:
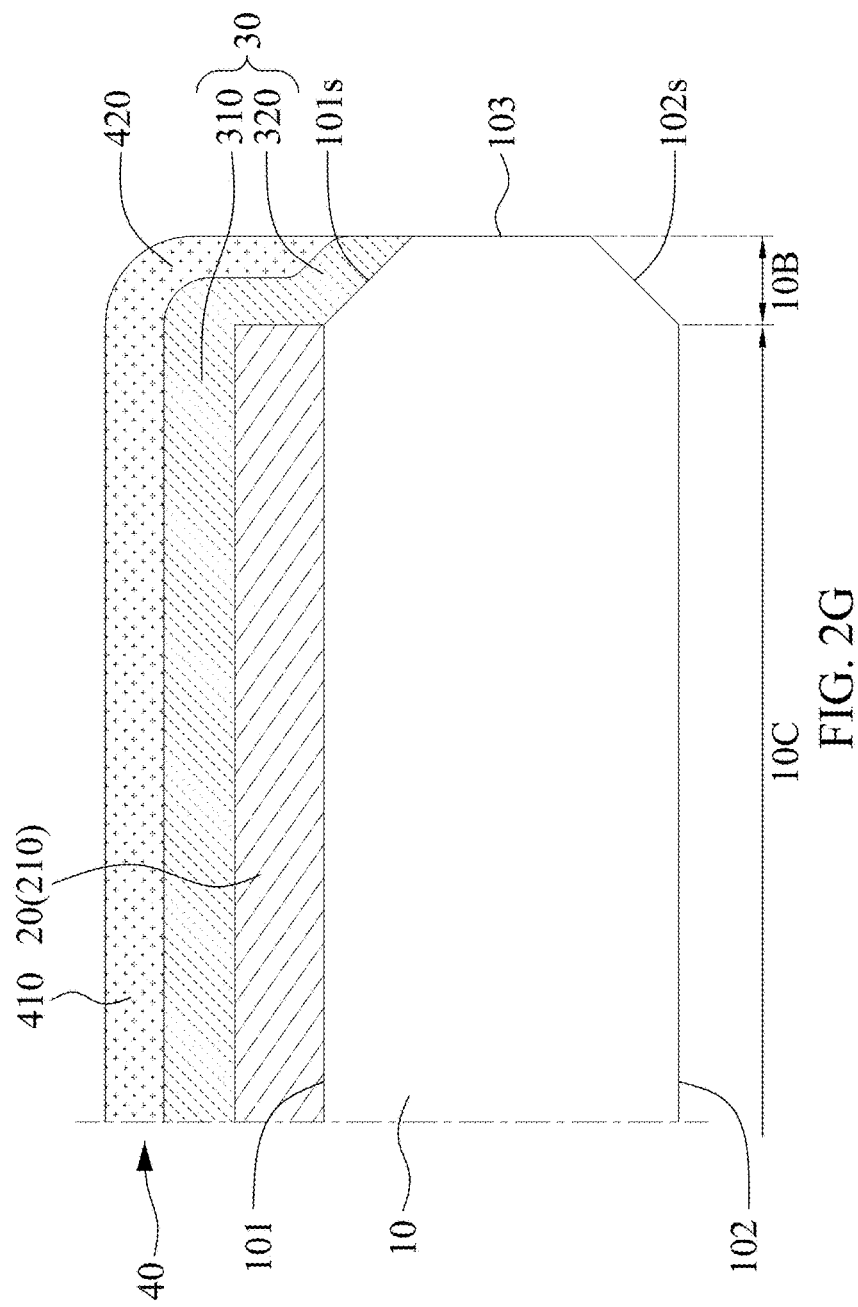
FIG. 2G is a cross-section illustrating one stage of a method of manufacturing a semiconductor structure, in accordance with some embodiments of the present disclosure.

Referring to FIG. 2G, FIG. 2G is a cross-section illustrating one stage of a method of manufacturing a semiconductor structure 1, in accordance with some embodiments of the present disclosure. In some embodiments, FIG. 2G is a cross-section along the cross-sectional line 2-2' of FIG. 1.

A material layer 40 may be formed on the material layer 30. In some embodiments, a cleaning operation may be performed on the material layer 30 prior to forming the material layer 40. In some embodiments, the cleaning operation is configured to clean an upper surface of the material layer 30 on which the material layer 40 is formed. In some embodiments, the cleaning operation removes defects which may possibly be formed from the formation of the material layer 30 or any contamination that can be removed by the cleaning operation. In some embodiments, the cleaning operation includes a scrubbing cleaning operation. In some embodiments, the cleaning operation includes scrubbing the upper surface of the material layer 30. In some embodiments, the cleaning operation includes scrubbing the upper surface of the material layer 30 by a brush (e.g., a rotating brush), a sponge, or any suitable scrubber.

In some embodiments, the material layer 40 may be formed over the central region 20C and the bevel region 20B of the semiconductor wafer 10. In some embodiments, the material 40 may be formed over the upper surface 101 and the inclined surface 101s of the semiconductor wafer 10. In some embodiments, the material layer 40 is different from the material layer 30. In some embodiments, the material layer 40 and the material layer 30 are formed of different materials. In some embodiments, the material layer 40 is different from the material layer 20. In some embodiments, the material layer 40 and the material layer 20 are formed of different materials. In some embodiments, the material layer 40 is formed by spin-coating. In some embodiments, the material layer 40 includes an underlayer. The underlayer may include a carbon-based material, an oxide-based material, or any suitable material according to actual applications. The underlayer may include a single layer or a multi-layered structure. As such, the semiconductor structure 1 is formed.

According to some embodiments of the present disclosure, the material layer 20 (e.g., the carbon-containing layer) over the bevel region 10B of the semiconductor wafer 10 is removed by the wet etching operation P2 followed by performing the baking operation P3, thus the portion 220 of the material layer 20 over the bevel region 10B can be fully removed, and the baking operation P3 can further remove any remained etching solution and impurities therein from the wet etching operation P2. As such, a relatively clean surface over the bevel region 10B can be provided for subsequent film formation (e.g., for the formation of the material layer 30). Therefore, the defects, particularly in-film defects, possibly formed with the formation of the material layer 30 can be minimized. In addition, the overall thickness of layers of structures over the bevel region 10B of the semiconductor wafer 10 can be reduced with the wet etching operation P2 and the baking operation P3, which is advantageous to pick-and-place operations of the semiconductor structure 1 without accidentally damaging the semiconductor structure 1, and delamination or peeling of the semiconductor structure 1 during pick-and-place operations can be effectively prevented.

While a relatively large mismatch of forces (e.g., compressive forces) between the carbon-containing layer (e.g., DLC) (i.e., the material layer 20) and the silicon-containing layer (e.g., amorphous silicon or polysilicon) (i.e., the material layer 30) may easily result in formation of in-film defects in the silicon-containing layer, and such defect formation is more likely to occur on inclined or slanted surfaces. In contrast, according to some embodiments of the present disclosure, a portion of the carbon-containing layer (i.e., the portion 220 of the material layer 20) over the inclined surface 101s of the semiconductor wafer 10 is partially removed by the dry etching operation P1 using oxygen gas and then fully removed by the wet etching operation P2, with the exposed surface further cleaned by the baking operation P3, such that the defect formation within the silicon-containing layer (i.e., the material layer 30) which is formed over the inclined surface 101s of the semiconductor wafer 10 can be mitigated. Therefore, the as-formed semiconductor structure 1 can be provided with an increased stability and reliability.

While an etching operation is performed on a target layer or structure including in-film defects, the in-film defects may adversely affect the performance of the etching operation. For example, the portion with the in-film defects may not be etched to the predetermined depth or extent, or the as-formed pattern formed by the etching operation may be unsatisfactory due to the presence of in-film defects. In contrast, according to some embodiments of the present disclosure, a portion of layers or structures over the bevel region 10B of the semiconductor wafer 10 is removed by a bevel trimming operation including the dry etching operation P1, the wet etching operation P2, and the baking operation P3, and thus a relatively clean surface over the bevel region 10B can be provided for subsequent film formation (e.g., for the formation of the material layer 30). Therefore, in-film defects which could have been formed within the film over the bevel region 10B can be minimized. As such, further etching operation(s) can be performed on the semiconductor structure 1 for forming required devices, and the aforesaid incomplete etching or unsatisfactory resulted patterns can be mitigated or prevented.

FIG. 3A, FIG. 3B, FIG. 3C, FIG. 3D, FIG. 3E, and FIG. 3F, illustrate various stages of a method of manufacturing a semiconductor structure 1A, in accordance with some embodiments of the present disclosure.

In some embodiments, the semiconductor structure 1 may be an intermediate structure, and further operations may be performed on the semiconductor structure 1 to form a semiconductor structure 1A including a multi-layered stacked structure including more layers or structures compared to that of the semiconductor structure 1 illustrated in FIG. 2G. In some embodiments, operations similar to those illustrated in FIG. 1, FIG. 2A, FIG. 2B, FIG. 2C, FIG. 2D, FIG. 2E, FIG. 2F, and FIG. 2G may be performed to form an intermediate semiconductor structure 1.

Figure 3A:
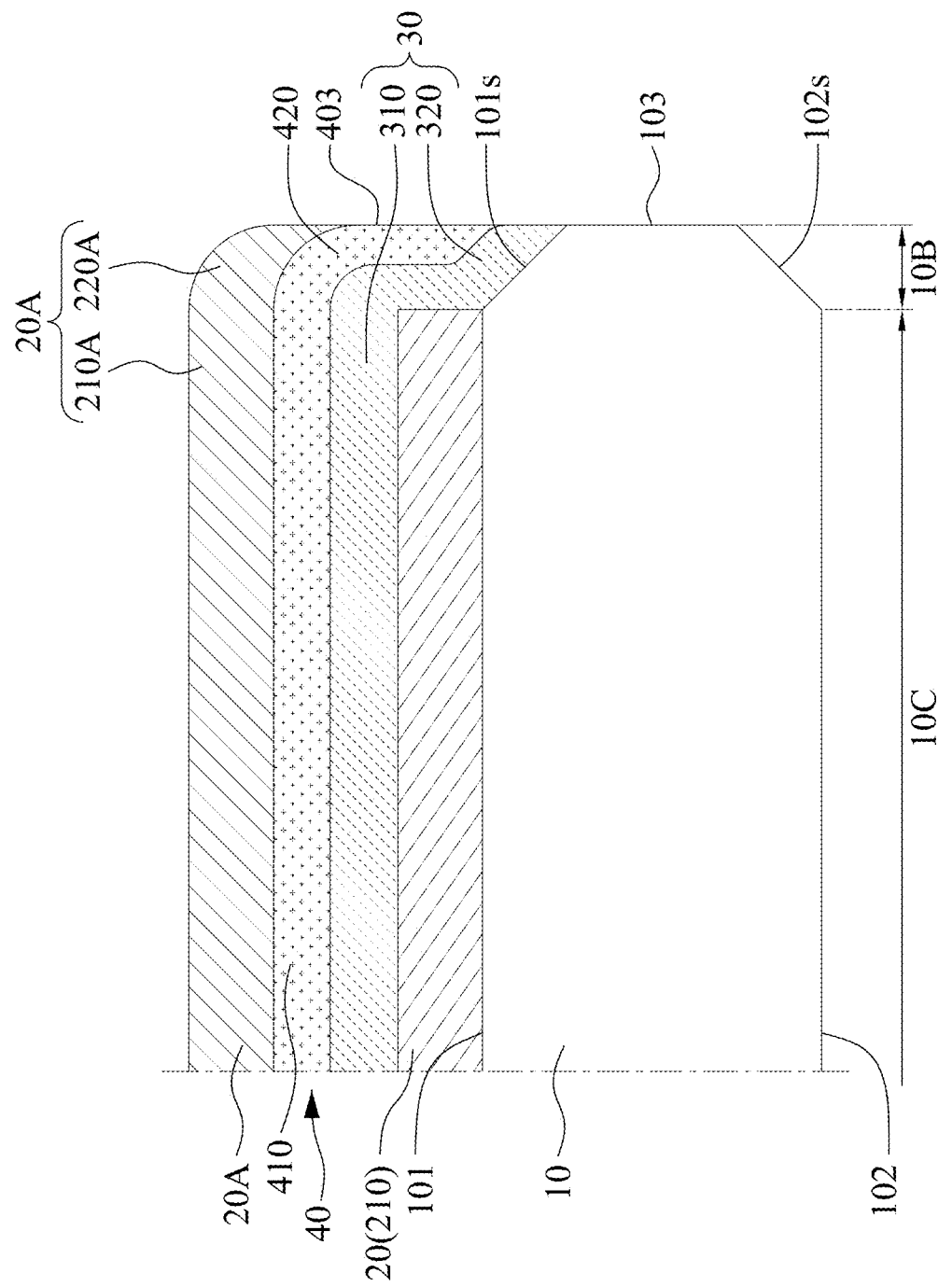
FIG. 3A is a cross-section illustrating one stage of a method of manufacturing a semiconductor structure, in accordance with some embodiments of the present disclosure.

Referring to FIG. 3A, FIG. 3A is a cross-section illustrating one stage of a method of manufacturing a semiconductor structure 1A, in accordance with some embodiments of the present disclosure. In some embodiments, FIG. 3A is a cross-section along the cross-sectional line 2-2' of FIG. 1.

A material layer 20A may be formed over the central region 10C and the bevel region 10B of the semiconductor wafer 10. In some embodiments, the material layer 20A is formed over the upper surface 101 and the inclined surface 101s of the semiconductor wafer 10. In some embodiments, one or more layers or structures (not shown) may be formed between the material layer 20A and the underlayer 40. In some embodiments, the material layer 20A includes a portion 210A over the central region 10C and a portion 220A over the bevel region 10B. In some embodiments, the material layer 20A includes a portion 210A over the upper surface 101 and a portion 220A over the inclined surface 101s of the semiconductor wafer 10. In some embodiments, the portion 220A of the material layer 20A may further extend on a lateral surface 403 of the underlayer 40 (not shown in drawings).

In some embodiments, the material layer 20A may be or include a carbon-containing layer. In some embodiments, the material layer 20A may be or include amorphous carbon, diamond-like carbon (DLC), or a combination thereof. In some embodiments, a thickness of the material layer 20A is from about 120 nm to about 160 nm. In some embodiments, a thickness of the material layer 20A is about 140 nm. In some embodiments, the material layer 20A is formed by chemical vapor deposition (CVD). In some embodiments, the material layer 20A is formed by chemical vapor deposition (CVD). In some embodiments, the material layer 20A is formed by a CVD operation using $C_2H_2$ as a precursor. In some embodiments, the deposition temperature for the CVD operation may be from about 250° C. to about 300° C. In some embodiments, the deposition temperature for the CVD operation may be about 275° C. In some embodiments, the deposition time for the CVD operation may be from about 130 seconds to about 160 seconds. In some embodiments, the deposition time for the CVD operation may be about 145 seconds.

Figure 3B:
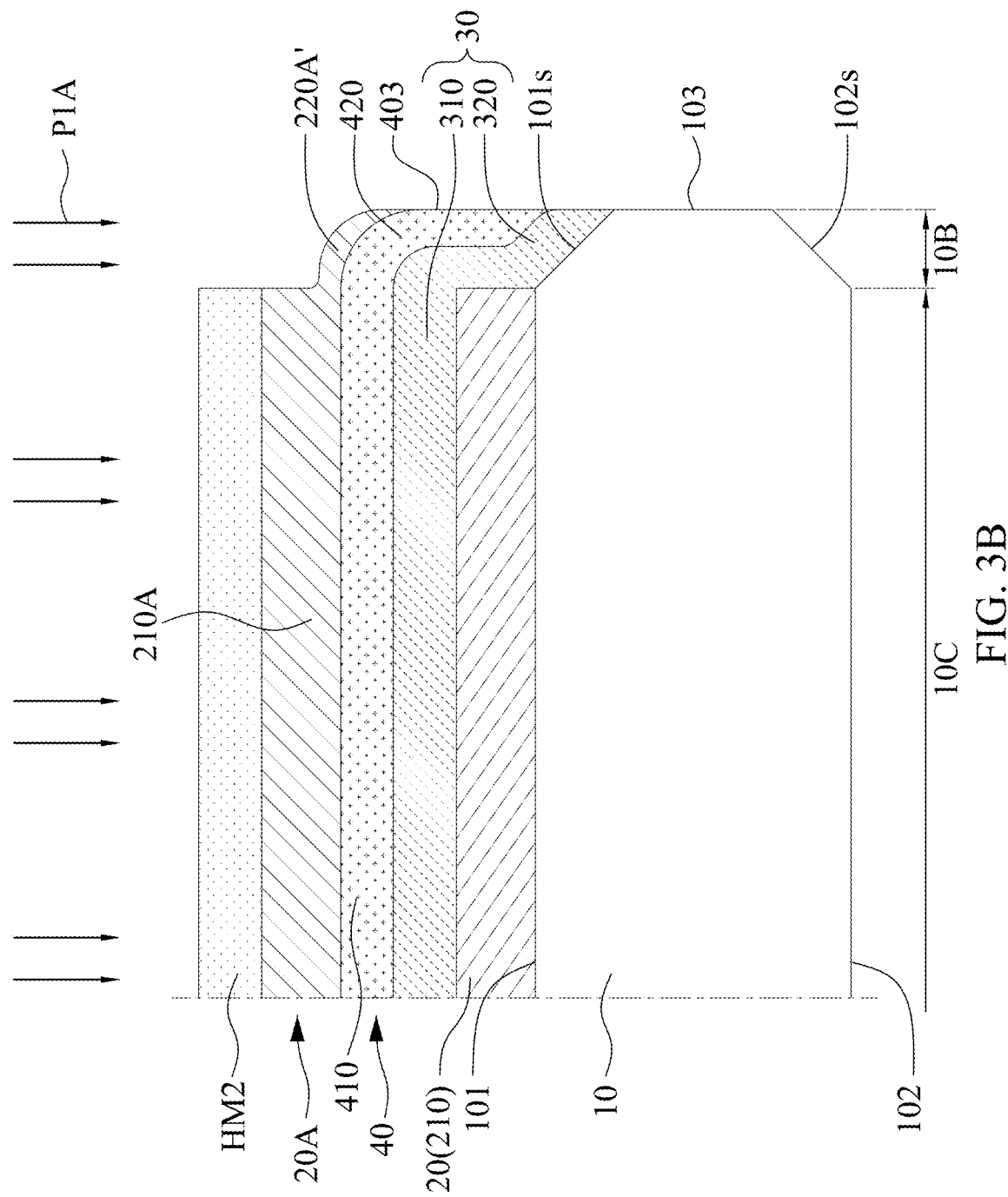
FIG. 3B is a cross-section illustrating one stage of a method of manufacturing a semiconductor structure, in accordance with some embodiments of the present disclosure.

Referring to FIG. 3B, FIG. 3B is a cross-section illustrating one stage of a method of manufacturing a semiconductor structure 1, in accordance with some embodiments of the present disclosure. In some embodiments, FIG. 3B is a cross-section along the cross-sectional line 2-2' of FIG. 1.

A dry etching operation P1A may be performed on the material layer 20A. In some embodiments, the material layer 20A is partially removed by the dry etching operation P1A. In some embodiments, the dry etching operation P1A is performed on the portion 220A of the material layer 20A over the bevel region 10B of the semiconductor wafer 10. In some embodiments, the portion 220A of the material layer 20A over the bevel region 10B of the semiconductor wafer 10 is partially removed by the dry etching operation P1A. In some embodiments, the portion 220A of the material layer 20A is partially removed to form a remained portion 220A' of the material layer 20A over the bevel region 10B of the semiconductor wafer 10. In some embodiments, the remained portion 220A' is formed on the inclined surface 101s of the semiconductor wafer 10. In some embodiments, the remained portion 220A' is further formed on at least a portion of the lateral surface 403 of the underlayer 40 (not shown in drawings). In some embodiments, a hardmask layer HM2 may be disposed over the central region 10C to cover the portion 210A of the material layer 20A when performing the dry etch operation P1A. The hardmask layer HM2 can protect the portion 210A of the material layer 20A over the central region 10C from being etched by the dry etching operation P1A.

The dry etching operation P1A may be an anisotropic etching operation. In some embodiments, the dry etching operation P1A may be or include a plasma dry etching operation. In some embodiments, the dry etching operation P1A may be or include a plasma dry etching operation using oxygen gas as an etching gas. In some embodiments, the material layer 20A includes a carbon-containing layer, and oxygen gas used as an etching gas can react with carbon to form carbon dioxide gas as a product. As such, the material layer 20A can be removed, and the as-formed product is carbon dioxide gas which can be removed easily. Accordingly, the dry etching operation P1A serving to partially remove the material layer 20A can provide a relatively clean reaction condition while only a gas product is formed which can be removed easily. In addition, the removal operation of the material layer 20A by the dry etching operation P1A is relatively simplified.

Figure 3C:
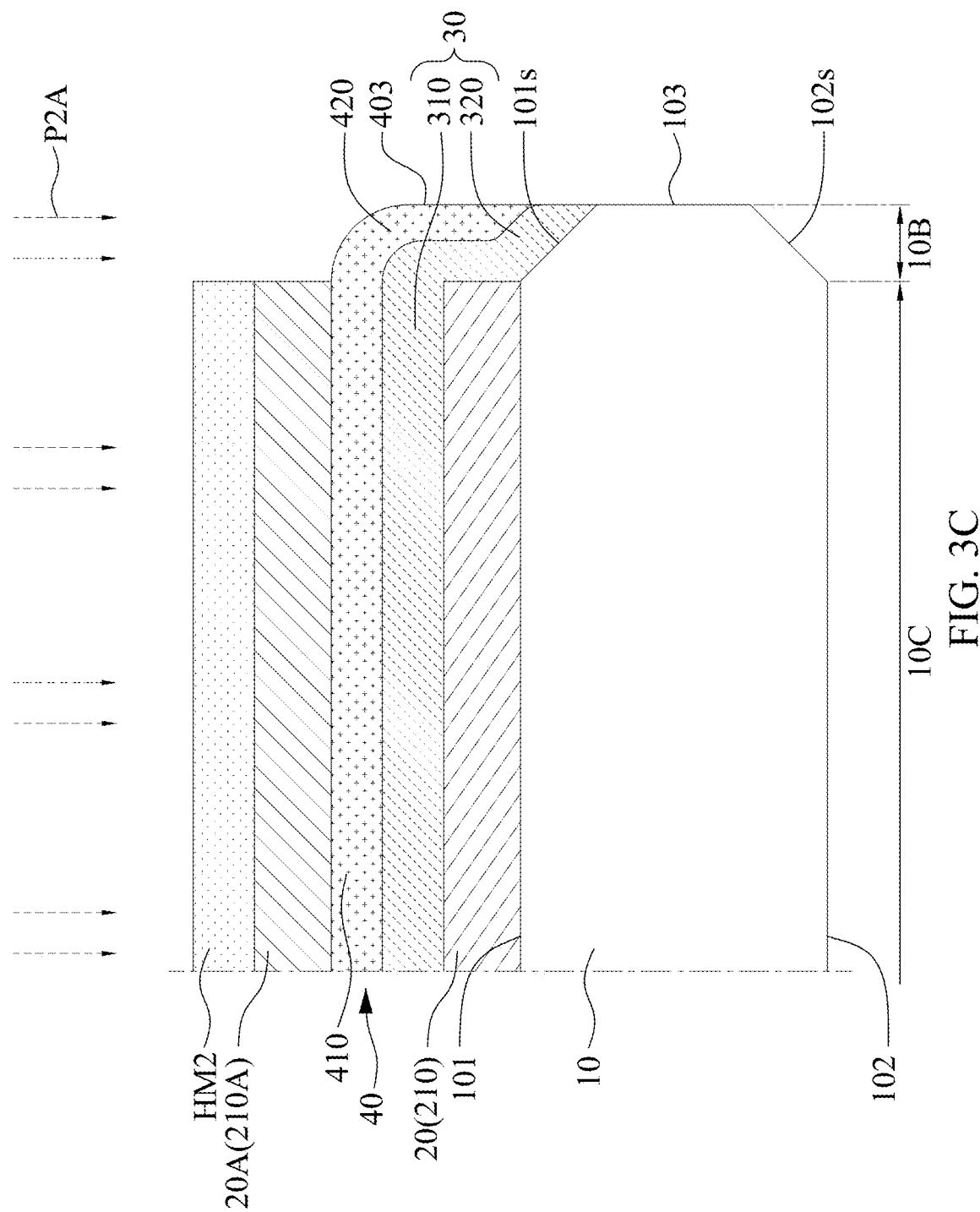
FIG. 3C is a cross-section illustrating one stage of a method of manufacturing a semiconductor structure, in accordance with some embodiments of the present disclosure.

Referring to FIG. 3C, FIG. 3C is a cross-section illustrating one stage of a method of manufacturing a semiconductor structure 1, in accordance with some embodiments of the present disclosure. In some embodiments, FIG. 3C is a cross-section along the cross-sectional line 2-2' of FIG. 1.

A wet etching operation P2A may be performed to remove the material layer 20A over the bevel region 10B of the semiconductor wafer 10. In some embodiments, the wet etching operation P2A is performed after performing the dry etching operation P1A (or the anisotropic etching operation). In some embodiments, the material layer 20A over the bevel region 10B of the semiconductor wafer 10 is fully removed by the wet etching operation P2A. In some embodiments, the remained portion 220A' of the material layer 20A over the bevel region 10B of the semiconductor wafer 10 is fully removed by the wet etching operation P2A. In some embodiments, the remained portion 220A' of the material layer 20A on the inclined surface 101s of the semiconductor wafer 10 is fully removed by the wet etching operation P2A. In some embodiments, the remained portion 220A' of the material layer 20A on the lateral surface 403 of the underlayer 40 is fully removed by the wet etching operation P2A. In some embodiments, the portion 210A of the material layer 20A is remained on the central region 10C of the semiconductor wafer 10 after the wet etching operation P2A is performed. In some embodiments, the wet etching operation P2A may be performed by using a mixture including ammonia ($NH_4OH$) and hydrogen peroxide ($H_2O_2$) as an etching solution.

In some other embodiments, one or more additional wet etching operations may be further performed to remove a portion 420 of the underlayer 40 over the bevel region 10B of the semiconductor wafer 10 (not shown in drawings). In some other embodiments, one or more additional wet etching operations may be further performed to remove a portion 420 of the underlayer 40 over the inclined surface 101s of the semiconductor wafer 10 (not shown in drawings). In the embodiments, a portion 410 of the underlayer 40 over the central region 10C of the semiconductor wafer 10 is remained after performing the aforesaid one or more additional wet etching operations for removing the portion 420 of the underlayer 40. In some other embodiments, one or more additional wet etching operations may be further performed to further remove the portion 320 of the material layer 30 over the bevel region 10B of the semiconductor wafer 10 (not shown in drawings). In some other embodiments, one or more additional wet etching operations may be further performed to further remove the portion 320 of the material layer 30 over the inclined surface 101s of the semiconductor wafer 10 (not shown in drawings). In the embodiments, the portion 310 of the material layer 30 over the central region 10C of the semiconductor wafer 10 is remained after performing the aforesaid one or more additional wet etching operations for removing the portion 320 of the material layer 30.

Figure 3D:
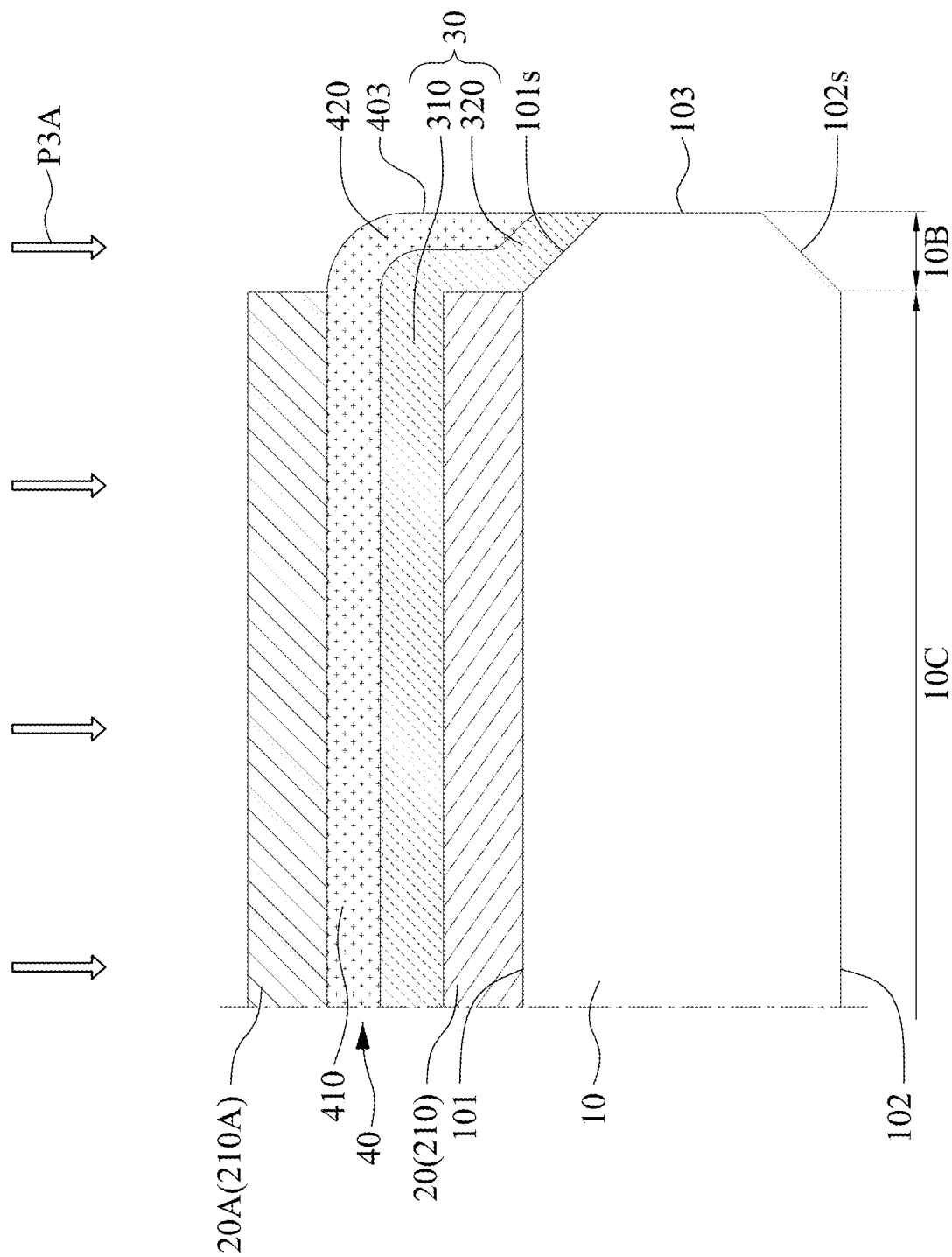
FIG. 3D is a cross-section illustrating one stage of a method of manufacturing a semiconductor structure, in accordance with some embodiments of the present disclosure.

Referring to FIG. 3D, FIG. 3D is a cross-section illustrating one stage of a method of manufacturing a semiconductor structure 1, in accordance with some embodiments of the present disclosure. In some embodiments, FIG. 3D is a cross-section along the cross-sectional line 2-2' of FIG. 1.

A baking operation P3A may be performed on the bevel region 10B of the semiconductor wafer 10. In some embodiments, the baking operation P3A is performed under a temperature equal to or greater than about 100° C. In some embodiments, the baking operation P3A is performed under a temperature equal to or greater than about 150° C. In some embodiments, the baking operation P3A is performed under a temperature equal to or greater than about 200° C. In some embodiments, the baking operation P3A is performed under a temperature equal to or greater than about 300° C. In some embodiments, the baking operation P3A is performed under a temperature equal to or greater than about 400° C. In some embodiments, the baking operation P3A is performed under a temperature from about 350° C. to about 450° C. In some embodiments, the baking operation P3A is performed for equal to or greater than about 90 seconds. In some embodiments, the baking operation P3A is performed for equal to or greater than about 120 seconds. In some embodiments, the baking operation P3A is performed for about 90 seconds to about 200 seconds. In some embodiments, the baking operation P3A is performed for about 100 seconds to about 150 seconds. In some embodiments, the baking operation P3A is performed for about 110 seconds to about 130 seconds. In some embodiments, the baking operation P3A is performed under a temperature of about 400° C. and for about 120 seconds.

The aforesaid ranges of the temperature of the baking operation P3A and the aforesaid ranges of the time duration of the baking operation P3A are critical as these parameters are provided with unexpected effects. While the baking temperature is relatively low or below the aforesaid ranges, the heat provided by the baking operation may be insufficient to completely remove the remained etching solution from the wet etching operation P2A; on the other hand, while the baking temperature is relatively high or exceed the aforesaid ranges, the heat provided by the baking operation may apply too much energy onto the structure and deteriorate the structural stability. In addition, while the baking time is relatively short or below the aforesaid ranges, the heat provided by the baking operation may be insufficient to completely remove the remained etching solution from the wet etching operation P2A; on the other hand, while the baking time is relatively long or exceed the aforesaid ranges, the overall processing time may undesirably increase, which may result in a decrease of the unit per hour (UPH) of the manufacturing process.

According to some embodiments of the present disclosure, with the aforesaid specific temperature or temperature ranges of the baking operation P3A, the remained etching solution from the wet etching operation P2A can be removed to provide a relatively clean surface for subsequent film formation (e.g., for the formation of the material layer 30A), and the structure can be provided with a satisfactory stability. In addition, with the aforesaid specific time duration or time duration ranges of the baking operation P3A, the remained etching solution from the wet etching operation P2A can be removed to provide a relatively clean surface for subsequent film formation (e.g., for the formation of the material layer 30A), and the UPH of the manufacturing process can be improved.

In some embodiments, the hardmask layer HM2 is removed prior to performing the baking operation P3A. In some embodiments, the combination of the dry etching operation P1A, the wet etching operation P2A, and the baking operation P3A is referred to as a bevel trimming operation.

Figure 3E:
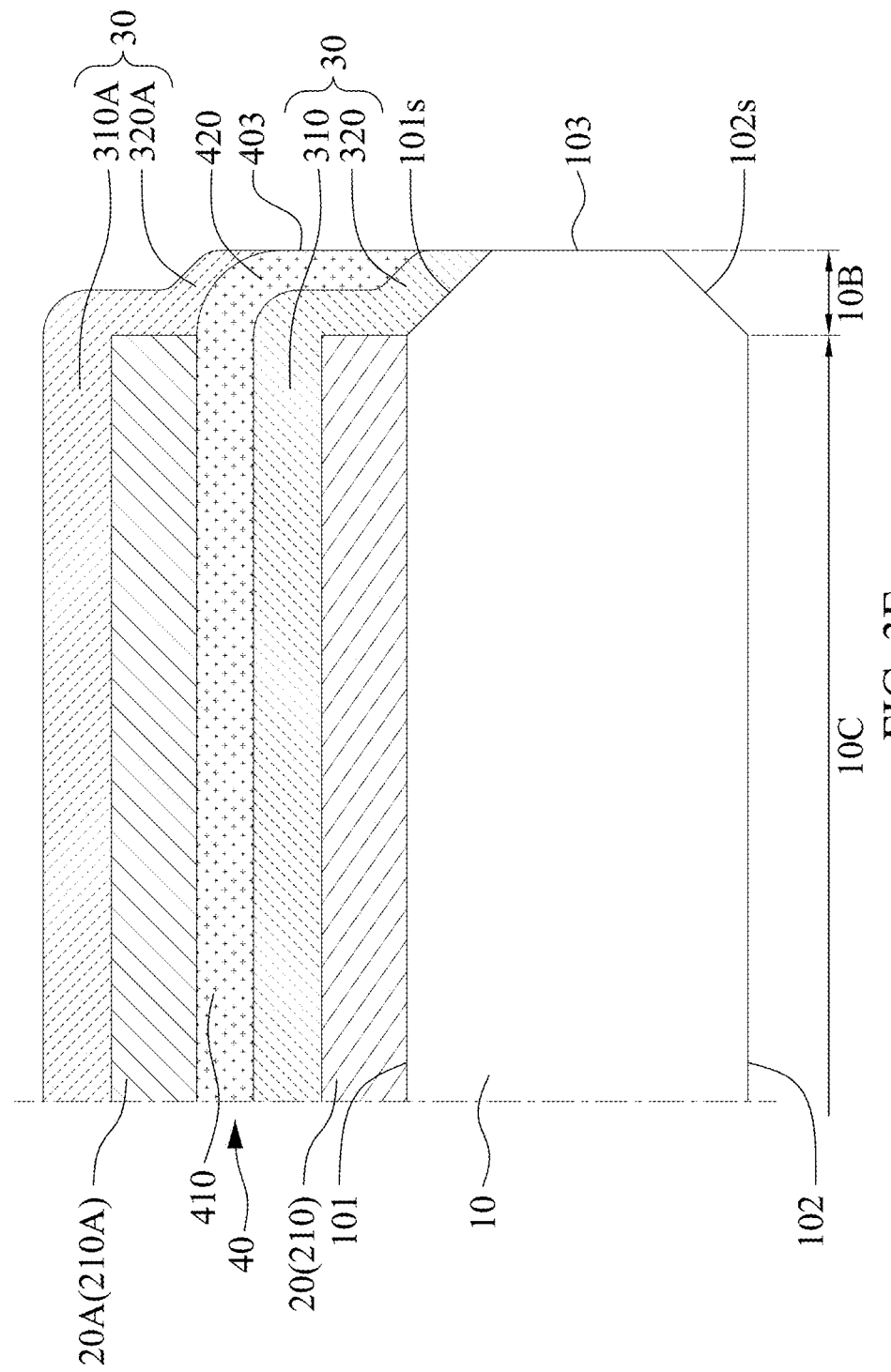
FIG. 3E is a cross-section illustrating one stage of a method of manufacturing a semiconductor structure, in accordance with some embodiments of the present disclosure.

Referring to FIG. 3E, FIG. 3E is a cross-section illustrating one stage of a method of manufacturing a semiconductor structure 1, in accordance with some embodiments of the present disclosure. In some embodiments, FIG. 3E is a cross-section along the cross-sectional line 2-2' of FIG. 1.

A material layer 30A may be formed over the central region 10C and the bevel region 10B of the semiconductor wafer 10. A material layer 30A may be formed over the upper surface 101 and the inclined surface 101s of the semiconductor wafer 10. In some embodiments, the material layer 30A is formed on the portion 210A of the material layer 20A that is formed on the central region 10C of the semiconductor wafer 10. In some embodiments, a portion 310A of the material layer 30A is formed on the portion 210A of the material layer 20A. In some embodiments, a portion 320A of the material layer 30A is formed over the bevel region 10B of the semiconductor wafer 10 and is free from contacting the material layer 20A (i.e., the portion 210A of the material layer 20A). In some embodiments, the portion 320A of the material layer 30A is formed on the portion 420 of the underlayer 40 over the bevel region 10B of the semiconductor wafer 10. In some other embodiments, the portion 420 of the underlayer 40 has been removed (not shown in drawings), and the portion 320A of the material layer 30A is formed on the portion 320 of the material layer 30 over the bevel region 10B of the semiconductor wafer 10. In some other embodiments, the portion 420 of the underlayer 40 and the portion 320 of the material layer 30 have been removed (not shown in drawings), and the portion 320A of the material layer 30A is formed on the inclined surface 101s of the semiconductor wafer 10.

In some embodiments, the material layer 30A is formed over the central region 10C and the bevel region 10B of the semiconductor wafer 10 after the baking operation P3A is performed. In some embodiments, forming the material layer 30A and performing the baking operation P3A are performed in an in-situ manner. In some embodiments, forming the material layer 30A and performing the baking operation P3A are performed in the same processing chamber. In some embodiments, the intermediate structure illustrated in FIG. 3D is transported or disposed in a processing chamber in which forming the material layer 30A is performed, the baking operation P3A is then performed in the processing chamber, and then the material layer 30A is formed after the baking operation P3A is completed. In some embodiments, a temperature for forming the material layer 30A and a temperature for performing the baking operation P3A are substantially the same. In some embodiments, forming the material layer 30A and performing the baking operation P3A use the same heating apparatus.

In some embodiments, forming the material layer 30A and performing the baking operation P3A are performed in different processing chambers. In some embodiments, the intermediate structure illustrated in FIG. 3D is transported to or disposed in a processing chamber (or "a first processing chamber"), and the baking operation P3A is then performed in the processing chamber. Next, after the baking operation P3A is completed, the intermediate structure is then transported to or disposed in a different processing chamber (or "a second processing chamber"), and then the material layer 30A is formed on the intermediate structure in the different processing chamber. In some embodiments, a temperature for forming the material layer 30A and a temperature for performing the baking operation P3A are substantially the same or different.

In some embodiments, the material layer 30A is different from the material layer 20A. In some embodiments, the material layer 30A and the material layer 20A are formed of different materials. In some embodiments, the material layer 30A may be or include a silicon-containing layer. In some embodiments, the material layer 30A may be or include amorphous silicon, polysilicon, doped silicon, or a combination thereof. In some embodiments, a thickness of the material layer 30A is from about 60 nm to about 80 nm. In some embodiments, a thickness of the material layer 30A is about 70 nm. In some embodiments, the material layer 30A is formed by chemical vapor deposition (CVD). In some embodiments, the material layer 30 is formed by a CVD operation using $SiH_4$ as a precursor. In some embodiments, the deposition temperature for the CVD operation may be from about 350° C. to about 450° C. In some embodiments, the deposition temperature for the CVD operation may be about 400° C. In some embodiments, the deposition time for the CVD operation may be from about 150 seconds to about 180 seconds. In some embodiments, the deposition time for the CVD operation may be about 165 seconds.

Figure 3F:
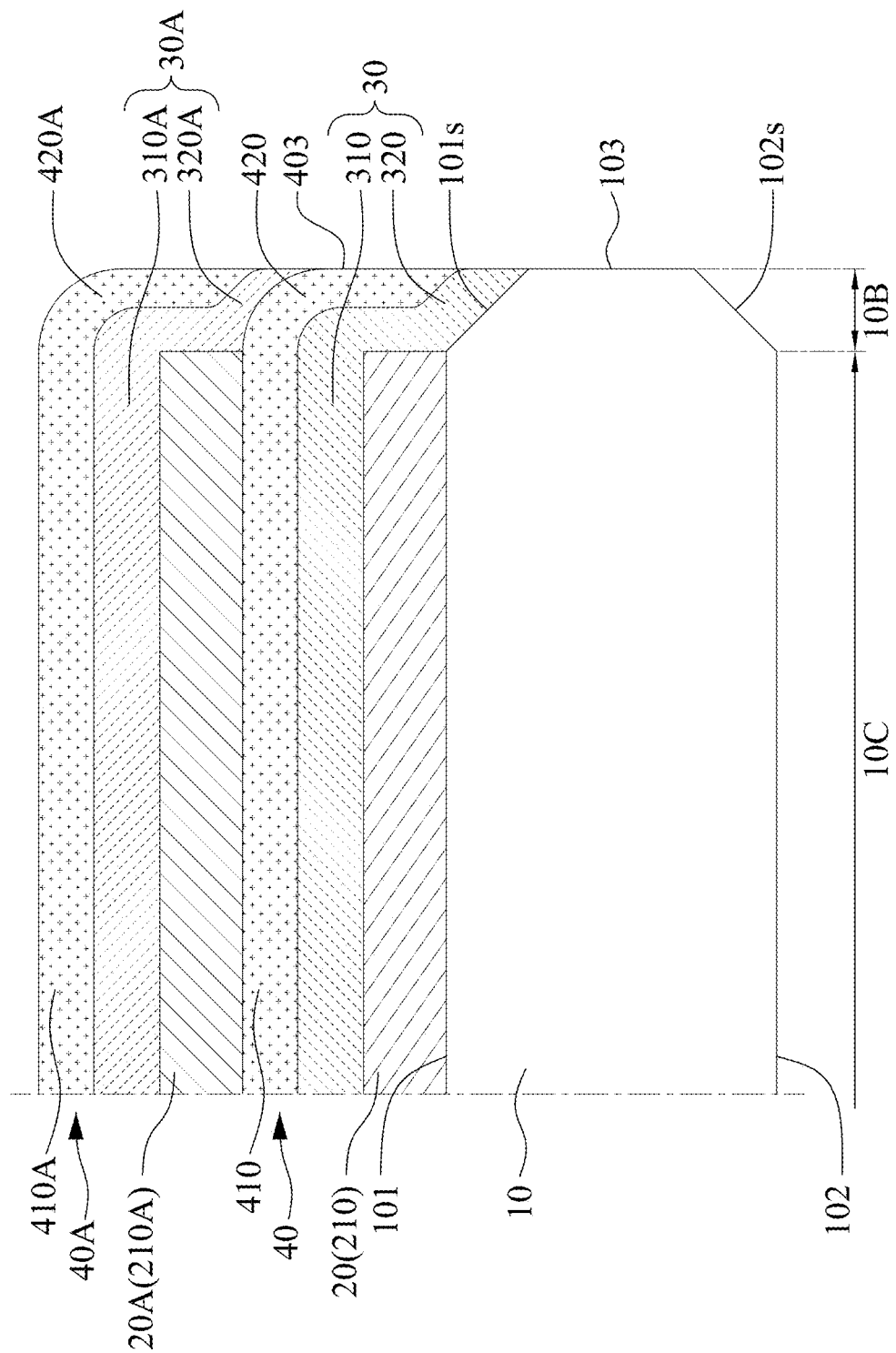
FIG. 3F is a cross-section illustrating one stage of a method of manufacturing a semiconductor structure, in accordance with some embodiments of the present disclosure.

Referring to FIG. 3F, FIG. 3F is a cross-section illustrating one stage of a method of manufacturing a semiconductor structure, in accordance with some embodiments of the present disclosure. In some embodiments, FIG. 3F is a cross-section along the cross-sectional line 2-2' of FIG. 1.

A material layer 40A may be formed on the material layer 30A. In some embodiments, a cleaning operation may be performed on the material layer 30A prior to forming the material layer 40A. In some embodiments, the cleaning operation is configured to clean an upper surface of the material layer 30A on which the material layer 40A is formed. In some embodiments, the cleaning operation removes defects which may possibly be formed from the formation of the material layer 30A or any contamination that can be removed by the cleaning operation. In some embodiments, the cleaning operation includes a scrubbing cleaning operation. In some embodiments, the cleaning operation includes scrubbing the upper surface of the material layer 30A. In some embodiments, the cleaning operation includes scrubbing the upper surface of the material layer 30A by a brush (e.g., a rotating brush), a sponge, or any suitable scrubber.

In some embodiments, the material layer 40A may be formed over the central region 20C and the bevel region 20B of the semiconductor wafer 10. In some embodiments, the material 40A may be formed over the upper surface 101 and the inclined surface 101s of the semiconductor wafer 10. In some embodiments, the material layer 40A is different from the material layer 30A. In some embodiments, the material layer 40A and the material layer 30A are formed of different materials. In some embodiments, the material layer 40A is different from the material layer 20A. In some embodiments, the material layer 40A and the material layer 20A are formed of different materials. In some embodiments, the material layer 40A is formed by spin-coating. In some embodiments, the material layer 40A includes an underlayer. The underlayer may include a carbon-based material, an oxide-based material, or any suitable material according to actual applications. The underlayer may include a single layer or a multi-layered structure. As such, the semiconductor structure 1A is formed.

Presented below are experimental results of exemplary semiconductor structures formed by methods of embodiments A1, A2, B1, B2, C1, C2, D1, D2, E1, E2, E3, E4, E5, F1, F2, F3, F4, and F5. Table 1 shows defect counts (i.e., number of defects observed over a single semiconductor wafer) of various semiconductor structures, in accordance with some embodiments of the present disclosure.

Embodiments A1 and A2 refer to semiconductor structures 1 performed with the aforesaid dry etching operation P1, the wet etching operation P2, and the baking operation P3. Formation of the material layer 30 and the baking operation P3 are performed in an in-situ manner, and the baking operation P3 is performed under a temperature of about 400° C. for about 120 seconds.

Embodiments B1, B2, C1, C2, D1, and D2 refer to semiconductor structures 1 performed with the aforesaid dry etching operation P1, the wet etching operation P2, and the baking operation P3. Formation of the material layer 30 and the baking operation P3 are performed in different processing chambers. The intermediate structures for embodiments B1, B2, C1, C2, D1, and D2 are transported from a processing chamber for the baking operation P3 to a different processing chamber for forming the material layer 30. The baking operation P3 is performed under a temperature of about 400° C. for about 90 seconds for embodiments B1 and B2, the baking operation P3 is performed under a temperature of about 400° C. for about 120 seconds for embodiments C1 and C2, and the baking operation P3 is performed under a temperature of about 400° C. for about 150 seconds for embodiments D1 and D2.

Embodiments E1, E2, E3, E4, and E5 refer to semiconductor structures including the materials layers 20 and 30 formed over the central region 10C and the bevel region 10B of the semiconductor wafer 10 without performing with any of the aforesaid dry etching operation P1, the wet etching operation P2, and the baking operation P3.

Embodiments F1, F2, F3, F4, and F5 refer to semiconductor structures including the materials layers 20 and 30 formed over the central region 10C and the bevel region 10B of the semiconductor wafer 10 without performing with any of the aforesaid dry etching operation P1, the wet etching operation P2, and the baking operation P3, and only performed with a dry etching operation as a bevel trimming operation to remove a portion of layers or structures over the bevel region 10B of the semiconductor wafer 10 after the underlayer 40 is formed.

TABLE 1

| | A1 | A2 |
|---|---|---|
| | P1 + P2 + P3, material layer and baking P3 performed in-situ | |
| Defect counts | 56 | 50 |
| | Average defect counts: 53 | |

| | B1 | B2 | C1 | C2 | D1 | D2 |
|---|---|---|---|---|---|---|
| | P1 + P2 + P3, material layer and baking P3 performed in different processing chambers | | | | | |
| | P3: 400° C./ 90 secs | | P3: 400° C./ 120 secs | | P3: 400° C./ 150 secs | |
| Defect counts | 96 | 65 | 85 | 99 | 75 | 67 |

TABLE 1-continued

| | Average defect counts: 81 | | Average defect counts: 92 | | Average defect counts: 71 |
|---|---|---|---|---|---|
| | E1 | E2 | E3 | E4 | E5 |
| | | Without any of P1, P2, and P3 | | | |
| Defect counts | 250 | 342 | 109 | 60 | 95 |
| | | | Average defect counts: 171 | | |
| | F1 | F2 | F3 | F4 | F5 |
| | | Without any of P1, P2, and P3, dry etch performed on underlayer 40 | | | |
| Defect counts | 59 | 69 | 69 | 52 | 54 |
| | | | Average defect counts: 61 | | |

Figure 4:
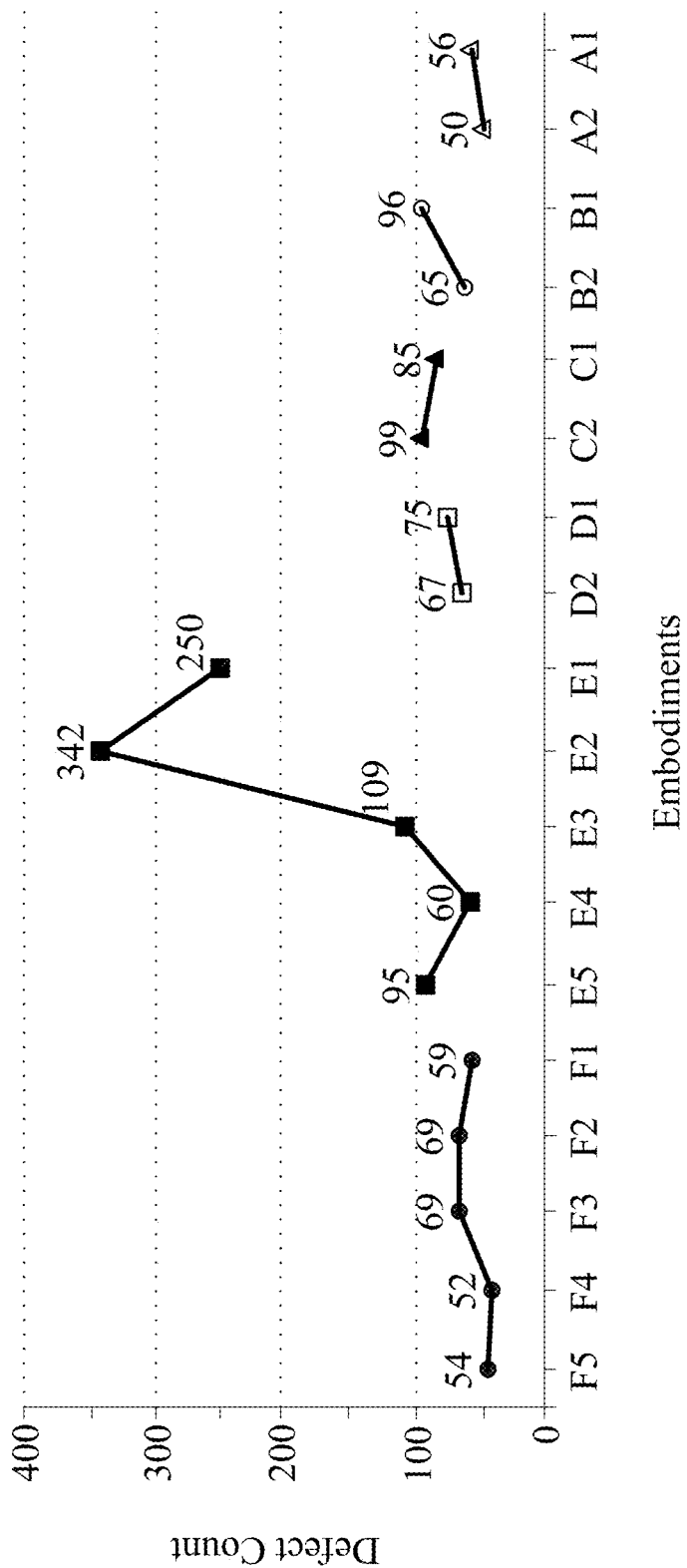
FIG. 4 is a diagram illustrating defect counts of various semiconductor structures, in accordance with some embodiments of the present disclosure.

FIG. 4 is a diagram illustrating defect counts of various semiconductor structures, in accordance with some embodiments of the present disclosure. Specifically, FIG. 4 illustrates the defect counts of exemplary semiconductor structures formed by methods of embodiments A1, A2, B1, B2, C1, C2, D1, D2, E1, E2, E3, E4, E5, F1, F2, F3, F4, and F5.

From the results shown in Table 1 and FIG. 4, embodiments E1, E2, E3, E4, E5, F1, F2, F3, F4, and F5 show that the defect counts are relatively high without performing the wet etching operation P2 and the baking operation P3, in accordance with some embodiments of the present disclosure. In addition, even with a dry etching operation performed on the underlayer 40 for bevel trimming instead of performing the wet etching operation P2 and the baking operation P3 to remove a portion of layers or structures over the bevel region 10B of the semiconductor wafer 10, the minimum defect counts are still relatively high and unsatisfactory.

From the results shown in Table 1 and FIG. 4, embodiments B1, B2, C1, C2, D1, and D2 show relatively low average defect counts, indicating performing the dry etching operation P1, the wet etching operation P2, and the baking operation P3 provides satisfactory results.

In addition, from the results shown in Table 1 and FIG. 4, embodiments A1 and A2 show the minimum average defect counts, indicating performing the dry etching operation P1, the wet etching operation P2, and the baking operation P3 for bevel trimming with formation of the material layer 30 and the baking operation P3 performed in an in-situ manner provides improved results.

FIG. 5A, FIG. 5B, FIG. 5C, FIG. 5D, FIG. 5E, and FIG. 5F illustrates defect conditions of various semiconductor structures, in accordance with some embodiments of the present disclosure.

Figure 5A:
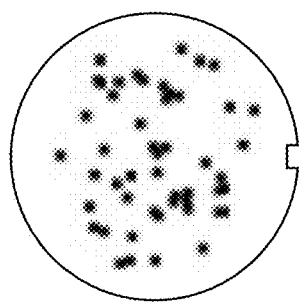
FIG. 5A illustrates defect conditions of various semiconductor structures, in accordance with some embodiments of the present disclosure.
Figure 5A:
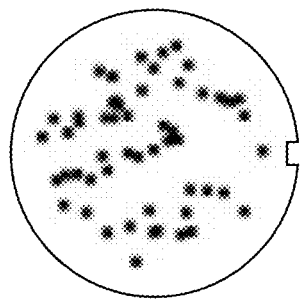
Figure 5A:
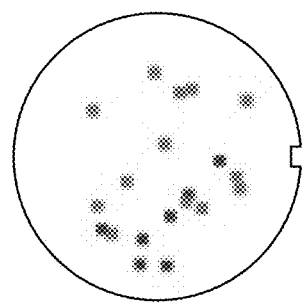
Figure 5A:
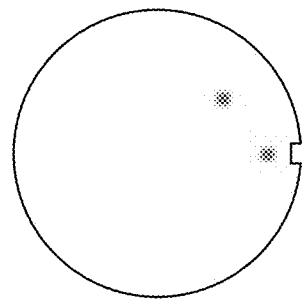

Referring to FIG. 5A, FIG. 5A illustrates defect conditions of semiconductor structures formed by methods of embodiments A1 and A2, wherein drawings A1a and A2a illustrate the distributions of all in-film defects observed, and drawings A1b and A2b illustrate the distributions of in-film defects having a size greater than about 1 μm. The results in FIG. 5A show that both all in-film defects and large in-film defects are provided with relatively low defect counts.

Figure 5B:
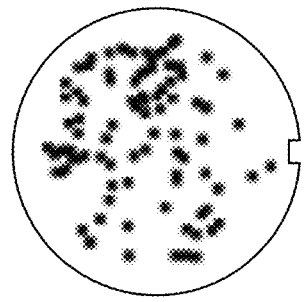
FIG. 5B illustrates defect conditions of various semiconductor structures, in accordance with some embodiments of the present disclosure.
Figure 5B:
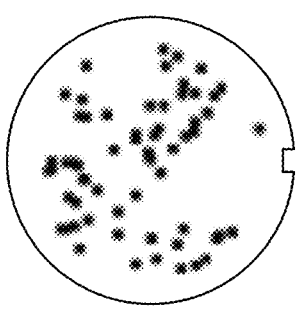
Figure 5B:
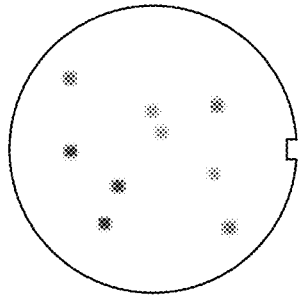
Figure 5B:
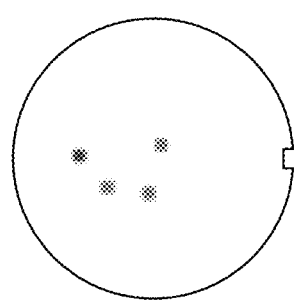

Referring to FIG. 5B, FIG. 5B illustrates defect conditions of semiconductor structures formed by methods of embodiments B1 and B2, wherein drawings B1a and B2a illustrate the distributions of all in-film defects observed, and drawings B1b and B2b illustrate the distributions of in-film defects having a size greater than about 1 μm. The results in FIG. 5B show that both all in-film defects and large in-film defects are provided with a relatively low defect counts.

Figure 5C:
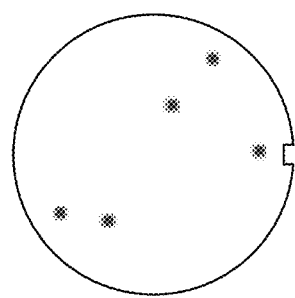
FIG. 5C illustrates defect conditions of various semiconductor structures, in accordance with some embodiments of the present disclosure.
Figure 5C:
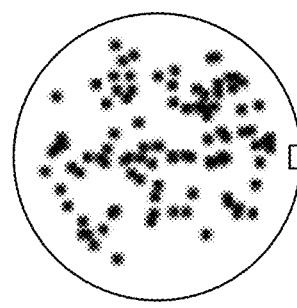
Figure 5C:
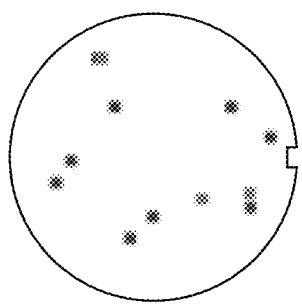
Figure 5C:
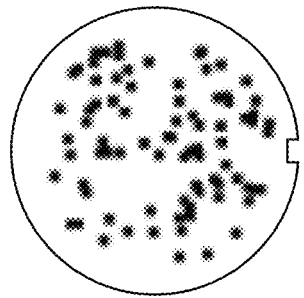

Referring to FIG. 5C, FIG. 5C illustrates defect conditions of semiconductor structures formed by methods of embodiments C1 and C2, wherein drawings C1a and C2a illustrate the distributions of all in-film defects observed, and drawings C1b and C2b illustrate the distributions of in-film defects having a size greater than about 1 μm. The results in FIG. 5C show that both all in-film defects and large in-film defects are provided with a relatively low defect counts.

Figure 5D:
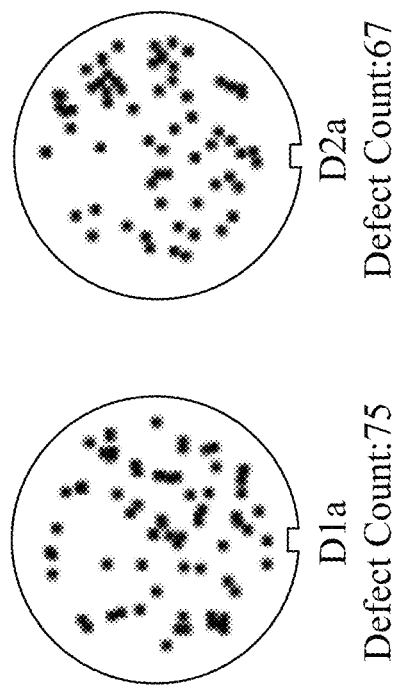
FIG. 5D illustrates defect conditions of various semiconductor structures, in accordance with some embodiments of the present disclosure.
Figure 5D:
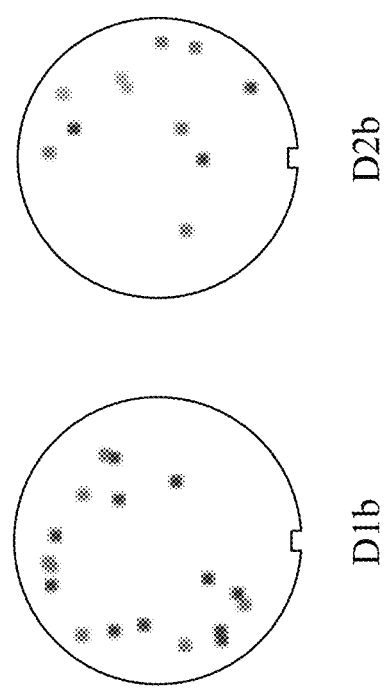

Referring to FIG. 5D, FIG. 5D illustrates defect conditions of semiconductor structures formed by methods of embodiments D1 and D2, wherein drawings D1a and D2a illustrate the distributions of all in-film defects observed, and drawings D1b and D2b illustrate the distributions of in-film defects having a size greater than about 1 μm. The results in FIG. 5D show that both all in-film defects and large in-film defects are provided with a relatively low defect counts. The results in FIG. 5D show that both all in-film defects and large in-film defects are provided with a relatively low defect counts.

Figure 5E:
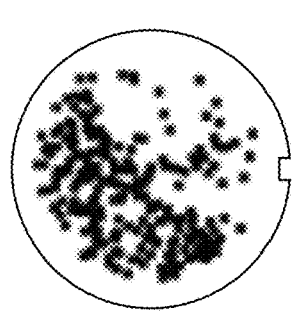
FIG. 5E illustrates defect conditions of various semiconductor structures, in accordance with some embodiments of the present disclosure.
Figure 5E:
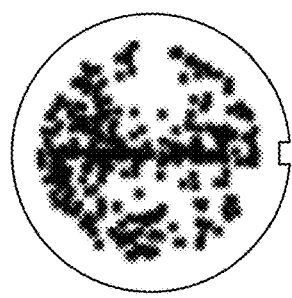
Figure 5E:
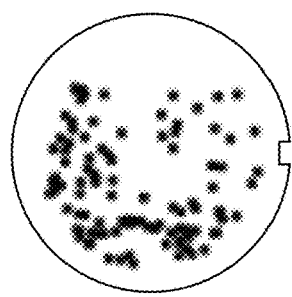
Figure 5E:
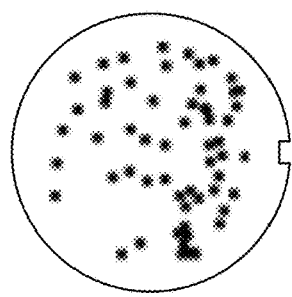
Figure 5E:
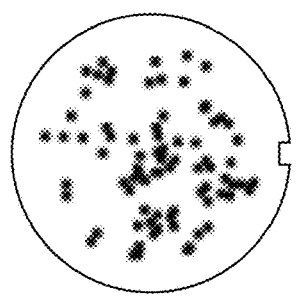
Figure 5E:
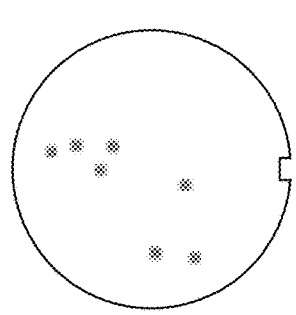
Figure 5E:
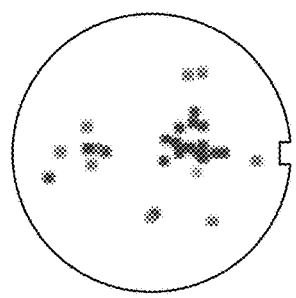
Figure 5E:
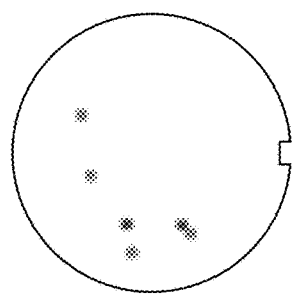
Figure 5E:
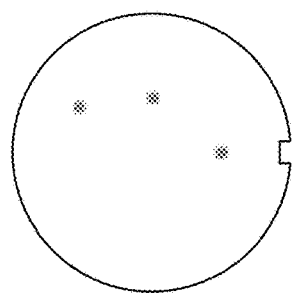
Figure 5E:
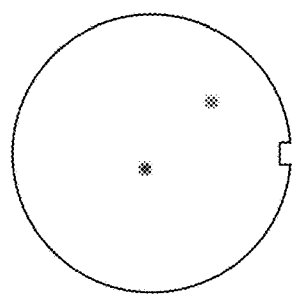

Referring to FIG. 5E, FIG. 5E illustrates defect conditions of semiconductor structures formed by methods of embodiments E1, E2, E3, E4, and E5, wherein drawings E1a, E2a, E3a, E4a, and E5a illustrate the distributions of all in-film defects observed, and drawings E1b, E2b, E3b, E4b, and E5b illustrate the distributions of in-film defects having a size e greater than about 1 μm. The results in FIG. 5E show that despite that some samples may be provided with relatively low defect counts, the consistency of defect counts for large in-film defects among various samples are low. That is, it indicates that the methods of embodiments E1, E2, E3, E4, and E5 provide unstable defect formation (or the defect removal) results.

Figure 5F:
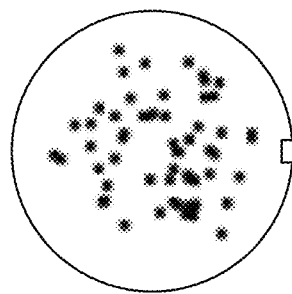
FIG. 5F illustrates defect conditions of various semiconductor structures, in accordance with some embodiments of the present disclosure.
Figure 5F:
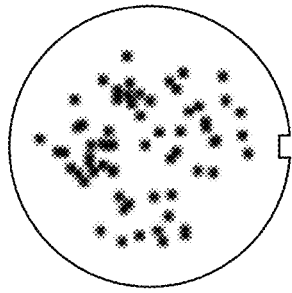
Figure 5F:
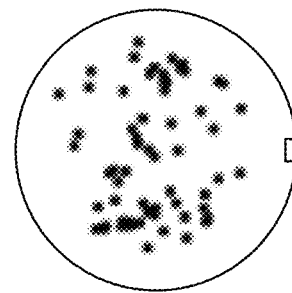
Figure 5F:
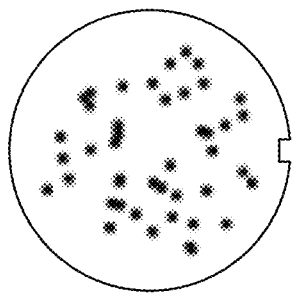
Figure 5F:
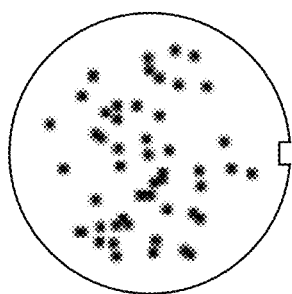
Figure 5F:
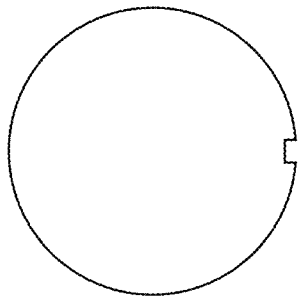
Figure 5F:
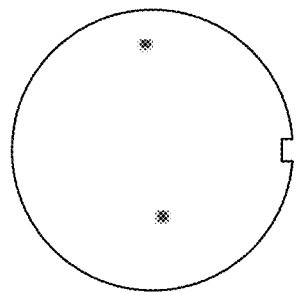
Figure 5F:
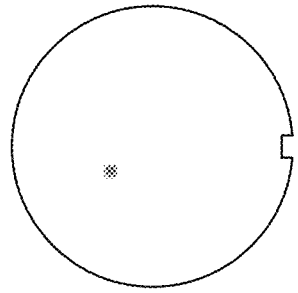
Figure 5F:
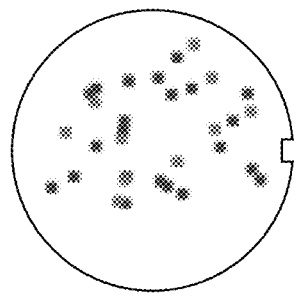
Figure 5F:
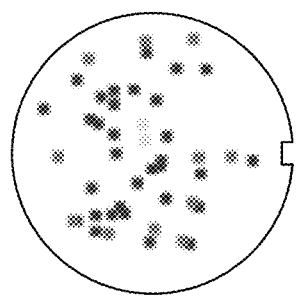

Referring to FIG. 5F, FIG. 5F illustrates defect conditions of semiconductor structures formed by methods of embodiments F1, F2, F3, F4, and F5, wherein drawings F1a, F2a, F3a, F4a, and F5a illustrate the distributions of all in-film defects observed, and drawings F1b, F2b, F3b, F4b, and F5b illustrate the distributions of in-film defects having a size greater than about 1 μm. The results in FIG. 5F show that not only the samples may be provided with relatively high defect counts, the consistency of defect counts for large in-film defects among various samples are also low. That is, it indicates that the methods of embodiments F1, F2, F3, F4, and F5 provide high defect counts and unstable defect formation (or the defect removal) results.

Figure 6:
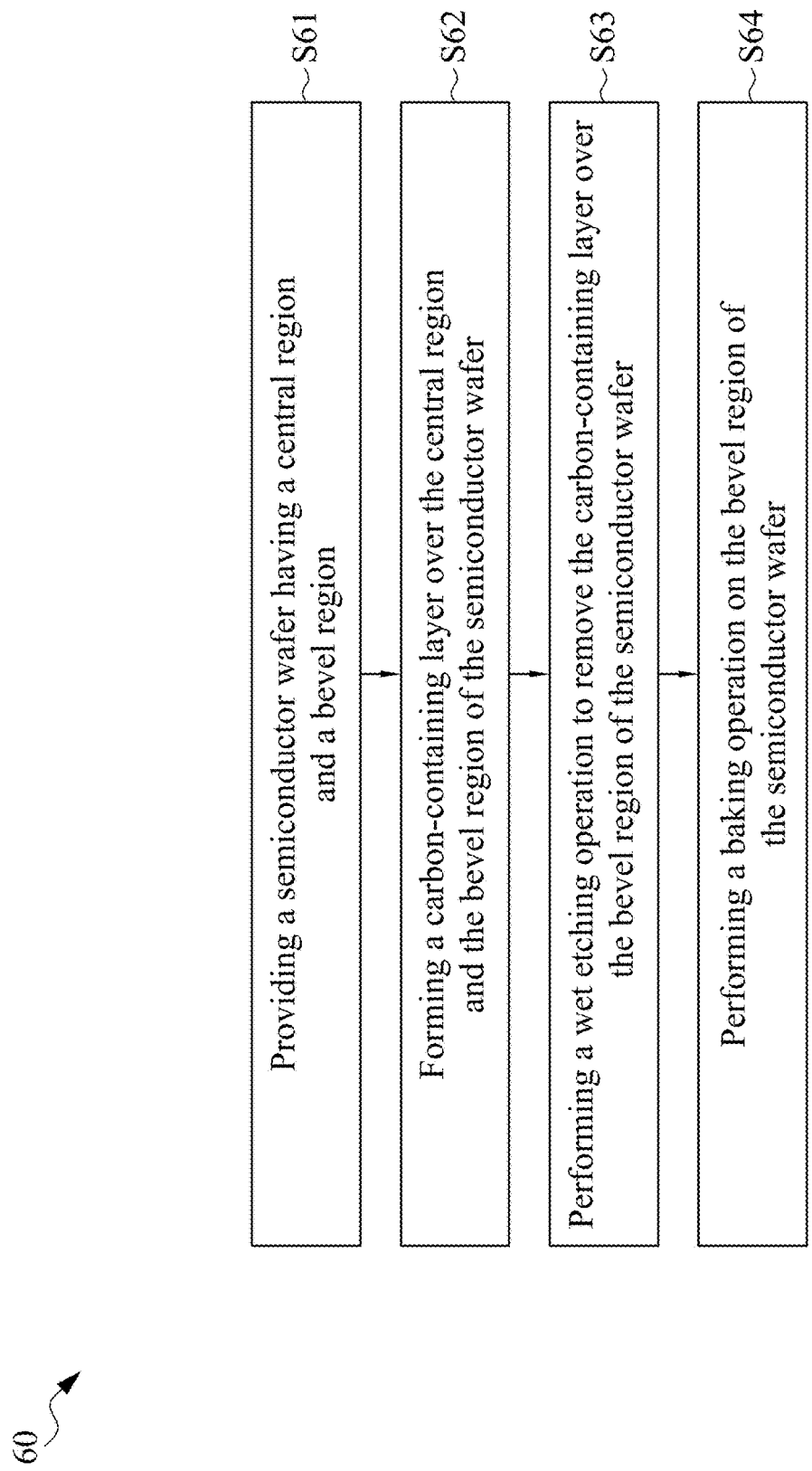
FIG. 6 is a flowchart illustrating a method of manufacturing a semiconductor structure, in accordance with some embodiments of the present disclosure.

FIG. 6 is a flowchart illustrating a method 60 of manufacturing a semiconductor structure, in accordance with some embodiments of the present disclosure.

The method 60 begins with operation S61 in which a semiconductor wafer having a central region and a bevel region is provided.

The method 60 continues with operation S62 in which a carbon-containing layer is formed over the central region and the bevel region of the semiconductor wafer.

The method 60 continues with operation S63 in which a wet etching operation is perform to remove the carbon-containing layer over the bevel region of the semiconductor wafer.

The method 60 continues with operation S64 in which a baking operation is performed on the bevel region of the semiconductor wafer.

The method 60 is merely an example, and is not intended to limit the present disclosure beyond what is explicitly recited in the claims. Additional operations can be provided before, during, or after each operations of the method 60, and some operations described can be replaced, eliminated, or moved around for additional embodiments of the method. In some embodiments, the method 60 can include further operations not depicted in FIG. 6. In some embodiments, the method 60 can include one or more operations depicted in FIG. 6.

Figure 7:
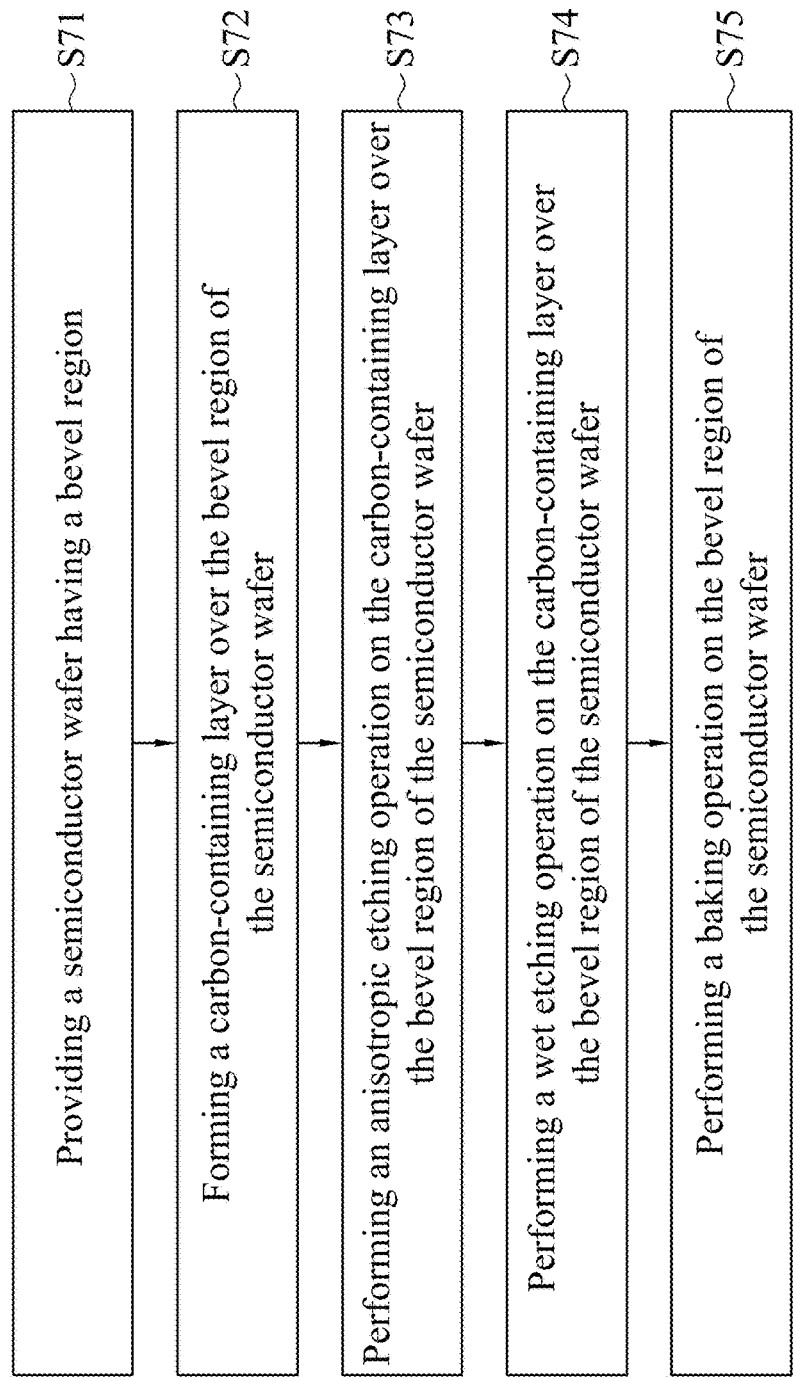
FIG. 7 is a flowchart illustrating a method of manufacturing a semiconductor structure, in accordance with some embodiments of the present disclosure.

FIG. 7 is a flowchart illustrating a method 70 of manufacturing a semiconductor structure, in accordance with some embodiments of the present disclosure.

The method 70 begins with operation S71 in which a semiconductor wafer having a bevel region is provided.

The method 70 continues with operation S72 in which a carbon-containing layer is formed over the bevel region of the semiconductor wafer.

The method 70 continues with operation S73 in which an anisotropic etching operation is performed on the carbon-containing layer over the bevel region of the semiconductor wafer.

The method 70 continues with operation S74 in which a wet etching operation is perform on the carbon-containing layer over the bevel region of the semiconductor wafer.

The method 70 continues with operation S75 in which a baking operation is performed on the bevel region of the semiconductor wafer.

The method 70 is merely an example, and is not intended to limit the present disclosure beyond what is explicitly recited in the claims. Additional operations can be provided before, during, or after each operations of the method 70, and some operations described can be replaced, eliminated, or moved around for additional embodiments of the method. In some embodiments, the method 70 can include further operations not depicted in FIG. 7. In some embodiments, the method 70 can include one or more operations depicted in FIG. 7.

Figure 8:
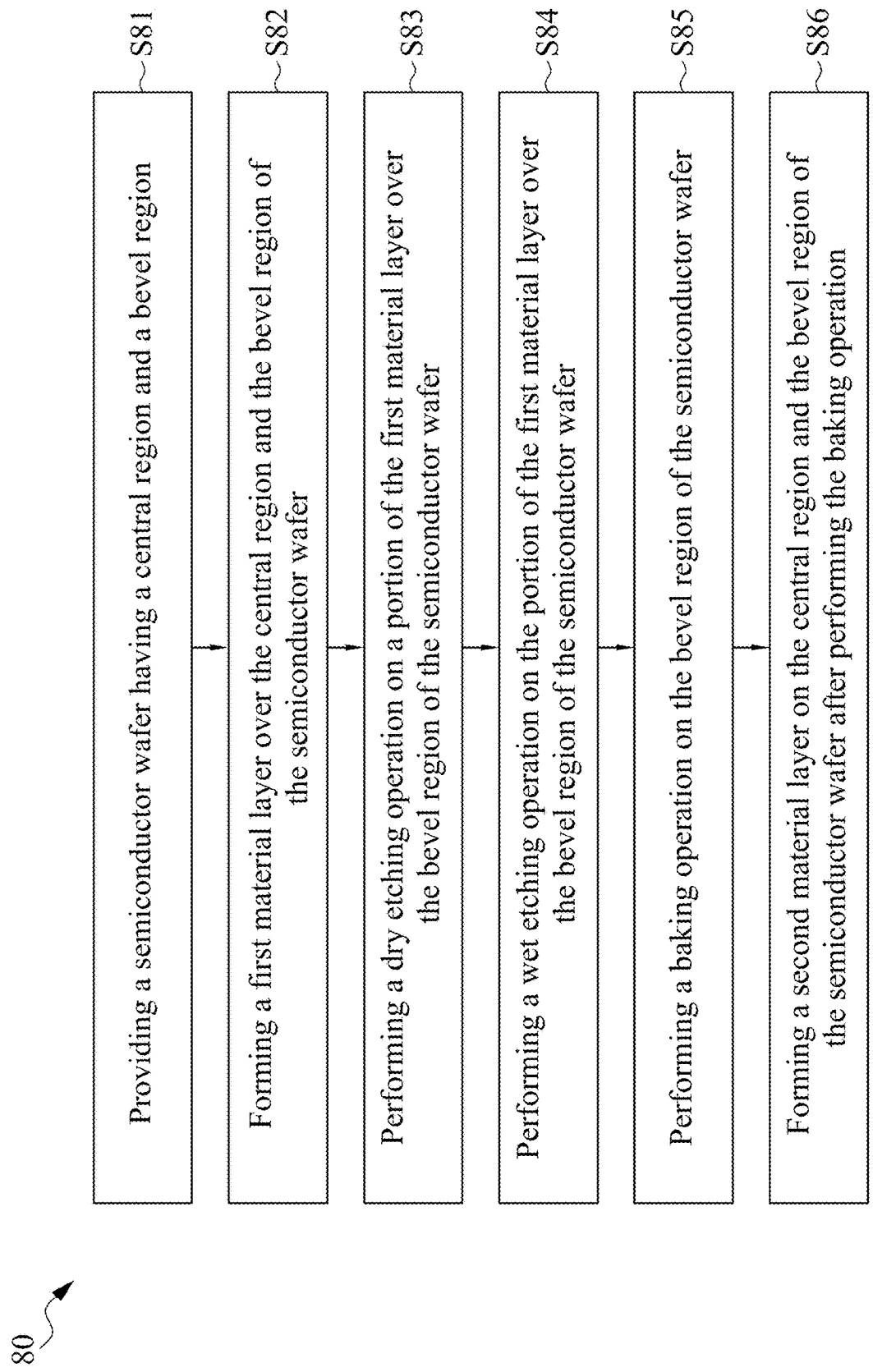
FIG. 8 is a flowchart illustrating a method of manufacturing a semiconductor structure, in accordance with some embodiments of the present disclosure.

FIG. 8 is a flowchart illustrating a method of manufacturing a semiconductor structure, in accordance with some embodiments of the present disclosure.

The method 80 begins with operation S81 in which a semiconductor wafer having a central region and a bevel region is provided.

The method 80 continues with operation S82 in which a first material layer is formed over the central region and the bevel region of the semiconductor wafer.

The method 80 continues with operation S83 in which a dry etching operation is performed on a portion of the first material layer over the bevel region of the semiconductor wafer.

The method 80 continues with operation S84 in which a wet etching operation is perform on the portion of the first material layer over the bevel region of the semiconductor wafer.

The method 80 continues with operation S85 in which a baking operation is performed on the bevel region of the semiconductor wafer.

The method 80 continues with operation S86 in which a second material layer is formed on the central region and the bevel region of the semiconductor wafer after performing the baking operation.

The method 80 is merely an example, and is not intended to limit the present disclosure beyond what is explicitly recited in the claims. Additional operations can be provided before, during, or after each operations of the method 80, and some operations described can be replaced, eliminated, or moved around for additional embodiments of the method. In some embodiments, the method 80 can include further operations not depicted in FIG. 8. In some embodiments, the method 80 can include one or more operations depicted in FIG. 8.

One aspect of the present disclosure provides a method of manufacturing a semiconductor structure. The method includes providing a semiconductor wafer having a central region and a bevel region. The method also includes forming a carbon-containing layer over the central region and the bevel region of the semiconductor wafer. The method further includes performing a wet etching operation to remove the carbon-containing over the bevel region of the semiconductor wafer. The method also includes performing a baking operation on the bevel region of the semiconductor wafer.

Another aspect of the present disclosure provides a method of manufacturing a semiconductor structure. The method includes providing a semiconductor wafer having a bevel region. The method also includes forming a carbon-containing layer over the bevel region of the semiconductor wafer. The method further includes performing an anisotropic etching operation on the carbon-containing layer over the bevel region of the semiconductor wafer. The method also includes performing a wet etching operation on the carbon-containing layer over the bevel region of the semiconductor wafer. The method further includes performing a baking operation on the bevel region of the semiconductor wafer.

Another aspect of the present disclosure provides a method of manufacturing a semiconductor structure. The method includes providing a semiconductor wafer having a central region and a bevel region. The method also includes forming a carbon-containing layer over the bevel region of the semiconductor wafer. The method further includes performing an anisotropic etching operation on the carbon-containing layer over the bevel region of the semiconductor wafer. The method also includes performing a wet etching operation on the carbon-containing layer over the bevel region of the semiconductor wafer. The method further performing a baking operation on the bevel region of the semiconductor wafer.

In the method of manufacturing the semiconductor structure, a bevel trimming operation includes performing at least a wet etching operation and a baking operation. The wet etching operation can fully remove a portion of layers or structures over the bevel region of a semiconductor wafer, and the following baking operation can further remove any remained etching solution and impurities therein from the wet etching operation. As such, a relatively clean surface over the bevel region can be provided for subsequent film formation. Therefore, defects, particularly in-film defects, possibly formed within a film subsequently formed over the bevel region can be minimized.

Although the present disclosure and its advantages have been described in detail, it should be understood that various changes, substitutions and alterations can be made herein without departing from the spirit and scope of the disclosure as defined by the appended claims. For example, many of the processes discussed can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of manufacturing a semiconductor structure, comprising:
   providing a semiconductor wafer having a central region and a bevel region;
   forming a first material layer over the central region and the bevel region of the semiconductor wafer;
   performing a dry etching operation on a portion of the first material layer over the bevel region of the semiconductor wafer;
   performing a wet etching operation on the portion of the first material layer over the bevel region of the semiconductor wafer;
   performing a baking operation on the bevel region of the semiconductor wafer; and
   forming a second material layer on the central region and the bevel region of the semiconductor wafer after performing the baking operation.

2. The method of claim 1, wherein the first material layer and the second material layer are formed of different materials.

3. The method of claim 1, wherein the first material layer comprises diamond-like carbon, and the second material layer comprises amorphous silicon.

4. The method of claim 3, wherein the dry etching operation comprises a plasma dry etching operation using oxygen gas as an etching gas.

5. The method of claim 1, wherein forming the second material layer and performing the baking operation are performed in an in-situ manner.

6. The method of claim 1, wherein the wet etching operation is performed by using a mixture comprising ammonia ($NH_4OH$) and hydrogen peroxide ($H_2O_2$) as an etching solution.

7. The method of claim 1, wherein a temperature for forming the second material layer and a temperature for performing the baking operation are substantially the same.

8. The method of claim 1, wherein the baking operation is performed under a temperature from about 350° C. to about 450° C. and for about 90 seconds to about 150 seconds.

9. The method of claim 1, further comprising:
   forming a third material layer on the second material layer over the central region and the bevel region of the semiconductor wafer, wherein the third material layer is different from the second material layer.

10. The method of claim 9, wherein the first material layer and the second material layer are formed by chemical vapor deposition, and the third material layer is formed by spin-coating.

* * * * *